United States Patent
Saji

(10) Patent No.: US 10,187,109 B2
(45) Date of Patent: Jan. 22, 2019

(54) FILTER CIRCUIT, FRONT END CIRCUIT, AND MODULE

(71) Applicant: TAIYO YUDEN CO., LTD., Tokyo (JP)

(72) Inventor: Tetsuo Saji, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/434,943

(22) Filed: Feb. 16, 2017

(65) Prior Publication Data

US 2017/0264336 A1 Sep. 14, 2017

(30) Foreign Application Priority Data

Mar. 14, 2016 (JP) ................. 2016-050141

(51) Int. Cl.
| H04B 1/16 | (2006.01) |
| H04B 1/48 | (2006.01) |
| H03H 9/54 | (2006.01) |
| H03H 9/64 | (2006.01) |
| H04L 5/14 | (2006.01) |
| H03H 9/60 | (2006.01) |
| H04L 5/00 | (2006.01) |
| H04W 84/04 | (2009.01) |

(52) U.S. Cl.
CPC ............. *H04B 1/48* (2013.01); *H03H 9/542* (2013.01); *H03H 9/605* (2013.01); *H03H 9/6403* (2013.01); *H03H 9/6483* (2013.01); *H04L 5/001* (2013.01); *H04L 5/14* (2013.01); *H03H 2210/012* (2013.01); *H03H 2210/025* (2013.01); *H04W 84/042* (2013.01)

(58) Field of Classification Search
CPC .... H04B 1/44; H04B 1/40; H04B 1/52; H04B 2001/1063
USPC .................. 455/82, 87, 550.1, 83, 340, 306
See application file for complete search history.

(56) References Cited

U.S. PATENT DOCUMENTS

| 5,486,797 | A | 1/1996 | Suzuki |
| 9,356,644 | B2 | 5/2016 | Okazaki et al. |
| 2003/0189910 | A1* | 10/2003 | Yamada ............... H01P 1/15 370/335 |
| 2004/0036551 | A1* | 2/2004 | Hirabayashi ...... H01P 1/20345 333/101 |

(Continued)

FOREIGN PATENT DOCUMENTS

| JP | H08-051381 A | 2/1996 |
| JP | 2005-217852 A | 8/2005 |

(Continued)

OTHER PUBLICATIONS

Japanese Office Action dated Jan. 30, 2018, in a counterpart Japanese patent application No. 2016-050141. (A machine translation (not reviewed for accuracy) attached.).

*Primary Examiner* — Tu X Nguyen
(74) *Attorney, Agent, or Firm* — Chen Yoshimura LLP

(57) ABSTRACT

A filter circuit includes: a variable filter that is connected between a common terminal and a node and configured to change a passband thereof; a receive switch connected between a receive terminal, from which a reception signal in a first band is output, and the node; and a transmit switch connected between a transmit terminal, to which a transmission signal in a second band different from the first band is input, and the node.

14 Claims, 32 Drawing Sheets

| LTE BAND | OPERATING BAND | TRANSMIT FREQUENCY [MHz] | RECEIVE FREQUENCY [MHz] | DUPLEX MODE |
|---|---|---|---|---|
| B1 | MB | 1920~1980 | 2110~2170 | FDD |
| B2 | MB | 1850~1910 | 1930~1990 | FDD |
| B3 | MB | 1710~1785 | 1805~1880 | FDD |
| B4 | MB | 1710~1755 | 2110~2155 | FDD |
| B5 | LB | 824~849 | 869~894 | FDD |
| B7 | HB | 2500~2570 | 2620~2690 | FDD |
| B8 | LB | 880~915 | 925~960 | FDD |
| B12 | LB | 699~716 | 729~746 | FDD |
| B13 | LB | 777~787 | 746~756 | FDD |
| B17 | LB | 704~716 | 734~746 | FDD |
| B20 | LB | 832~862 | 791~821 | FDD |
| B22 | VHB | 3410~3490 | 3510~3590 | FDD |
| B25 | MB | 1850~1915 | 1930~1995 | FDD |
| B26 | LB | 814~849 | 859~894 | FDD |
| B27 | LB | 807~824 | 852~869 | FDD |
| B28 | LB | 703~748 | 758~803 | FDD |
| B29 | LB | – | 717~728 | FDD |
| B30 | HB | 2305~2315 | 2350~2360 | FDD |
| B34 | MB | 2010~2025 | | TDD |
| B35 | MB | 1850~1910 | | TDD |
| B36 | MB | 1930~1990 | | TDD |
| B38 | HB | 2570~2620 | | TDD |
| B39 | MB | 1880~1920 | | TDD |
| B40 | HB | 2300~2400 | | TDD |
| B41 | HB | 2496~2690 | | TDD |
| B42 | VHB | 3400~3600 | | TDD |

(56) References Cited

U.S. PATENT DOCUMENTS

| | | |
|---|---|---|
| 2005/0212612 A1 | 9/2005 | Kawakubo et al. |
| 2012/0093044 A1 | 4/2012 | Ishida |
| 2013/0273861 A1 | 10/2013 | See |
| 2014/0038531 A1 | 2/2014 | Hayafuji et al. |
| 2014/0206299 A1 | 7/2014 | Murase et al. |
| 2014/0321312 A1 | 10/2014 | Narahashi et al. |
| 2015/0372702 A1* | 12/2015 | Asuri .................. H04B 1/1027 455/77 |
| 2018/0131500 A1* | 5/2018 | Pehlke .................. H04B 1/525 |

FOREIGN PATENT DOCUMENTS

| | | |
|---|---|---|
| WO | 2011/004525 A1 | 1/2011 |
| WO | 2013/047358 A1 | 4/2013 |
| WO | 2014/010575 A1 | 1/2014 |
| WO | 2015/112673 A1 | 7/2015 |
| WO | 2015/128007 A1 | 9/2015 |

* cited by examiner

FIG. 1

| LTE BAND | OPERATING BAND | TRANSMIT FREQUENCY [MHz] | RECEIVE FREQUENCY [MHz] | DUPLEX MODE |
|---|---|---|---|---|
| B1 | MB | 1920~1980 | 2110~2170 | FDD |
| B2 | MB | 1850~1910 | 1930~1990 | FDD |
| B3 | MB | 1710~1785 | 1805~1880 | FDD |
| B4 | MB | 1710~1755 | 2110~2155 | FDD |
| B5 | LB | 824~849 | 869~894 | FDD |
| B7 | HB | 2500~2570 | 2620~2690 | FDD |
| B8 | LB | 880~915 | 925~960 | FDD |
| B12 | LB | 699~716 | 729~746 | FDD |
| B13 | LB | 777~787 | 746~756 | FDD |
| B17 | LB | 704~716 | 734~746 | FDD |
| B20 | LB | 832~862 | 791~821 | FDD |
| B22 | VHB | 3410~3490 | 3510~3590 | FDD |
| B25 | MB | 1850~1915 | 1930~1995 | FDD |
| B26 | LB | 814~849 | 859~894 | FDD |
| B27 | LB | 807~824 | 852~869 | FDD |
| B28 | LB | 703~748 | 758~803 | FDD |
| B29 | LB | – | 717~728 | FDD |
| B30 | HB | 2305~2315 | 2350~2360 | FDD |
| B34 | MB | 2010~2025 | | TDD |
| B35 | MB | 1850~1910 | | TDD |
| B36 | MB | 1930~1990 | | TDD |
| B38 | HB | 2570~2620 | | TDD |
| B39 | MB | 1880~1920 | | TDD |
| B40 | HB | 2300~2400 | | TDD |
| B41 | HB | 2496~2690 | | TDD |
| B42 | VHB | 3400~3600 | | TDD |

FIG. 24

| LTE BAND | REGION | LTE BAND | REGION |
|---|---|---|---|
| B1+B3 | All | B5+B7 | EMEA |
| B1+B5 | NAR | B5+B12 | NAR |
| B1+B7 | EMEA | B5+B13 | NAR |
| B1+B8 | All | B5+B17 | NAR |
| B1+B20 | EMEA | B5+B25 | NAR |
| B1+B26 | NAR | B5+B29 | NAR |
| B1+B28 | APAC | B5+B40 | China |
| B1+B40 | China | B7+B8 | EMEA |
| B1+B41 | All | B7+B12 | EMEA |
| B1+B42 | All | B7+B20 | EMEA |
| B2+B4 | NAR | B7+B22 | EMEA |
| B2+B5 | NAR | B7+B28 | APAC |
| B2+B12 | NAR | B7+B40 | China |
| B2+B13 | NAR | B8+B20 | EMEA |
| B2+B17 | NAR | B8+B40 | China |
| B2+B28 | APAC | B8+B41 | All |
| B2+B29 | NAR | B12+B25 | NAR |
| B3+B5 | NAR | B20+B42 | EMEA |
| B3+B7 | EMEA | B25+B26 | NAR |
| B3+B8 | All | B25+B41 | NAR |
| B3+B20 | EMEA | B26+B41 | NAR |
| B3+B26 | NAR | B38+B40 | EMEA/China |
| B3+B28 | APAC | B39+B41 | EMEA/China |
| B3+B38 | EMEA | B41+B42 | All |
| B3+B40 | China | | |
| B3+B42 | All | | |
| B4+B5 | NAR | | |
| B4+B7 | EMEA | | |
| B4+B12 | NAR | | |
| B4+B13 | NAR | | |
| B4+B17 | NAR | | |
| B4+B27 | NAR | | |
| B4+B28 | APAC | | |
| B4+B29 | NAR | | |

FIG. 25A

| LTE BAND | REGION |
|---|---|
| B1+B3+B5 | NAR |
| B1+B3+B8 | All |
| B1+B3+B20 | EMEA |
| B1+B3+B26 | NAR |
| B1+B3+B28 | APAC |
| B1+B3+B42 | All |
| B1+B5+B7 | EMEA |
| B1+B7+B20 | EMEA |
| B1+B7+B28 | APAC |
| B1+B18+B28 | APAC |
| B2+B4+B5 | NAR |
| B2+B4+B12 | NAR |
| B2+B4+B13 | NAR |
| B2+B4+B29 | NAR |
| B2+B5+B12 | NAR |
| B2+B5+B13 | NAR |
| B2+B5+B29 | NAR |
| B3+B7+B8 | All |
| B3+B7+B20 | EMEA |
| B3+B7+B28 | APAC/EMEA |
| B3+B8+B40 | China |
| B4+B5+B12 | NAR |
| B4+B5+B13 | NAR |
| B4+B5+B29 | NAR |
| B4+B7+B12 | APAC |
| B7+B8+B20 | EMEA |

FIG. 25B

| LTE BAND | REGION |
|---|---|
| B2+B4+B5+B29 | NAR |

FILTER CIRCUIT, FRONT END CIRCUIT, AND MODULE

CROSS-REFERENCE TO RELATED APPLICATION

This application is based upon and claims the benefit of priority of the prior Japanese Patent Application No. 2016-050141, filed on Mar. 14, 2016, the entire contents of which are incorporated herein by reference.

FIELD

A certain aspect of the present invention relates to a filter circuit, a front end circuit, and a module.

BACKGROUND

Wireless communication devices such as mobile phone terminals may transmit and receive signals of a plurality of bands. For example, Long Term Evolution (LTE) or the like uses a Low Band (LB) equal to or less than 1 GHz, a Middle Band (MB) around 2 GHz, a High Band (HB) around 2.5 GHz, and a Very High Band (VHB) around 3.5 GHz. Each of the Low Band, the Middle Band, the High Band, and the Very High Band includes a plurality of bands each including a transmit band and a receive band.

International Publication No. 2011/004525 describes that a tunable duplexer is provided to support a plurality of bands. U.S. Patent Application Publication No. 2013/0273861 describes that a filter to be connected to an antenna is switched with a switch. International Publication No. 2015/128007 and U.S. Patent Application Publication No. 2014/0038531 describe that a tunable filter is used as a transmit filter and a receive filter. International Publication No. 2015/112673 describes that an impedance adjustment circuit is located between a filter and an antenna.

To support multiple bands, many filters are used. The use of a variable filter can reduce the number of filters. However, in the above-described documents, the number of filters are not efficiently reduced.

SUMMARY OF THE INVENTION

According to a first aspect of the present invention, there is provided a filter circuit including: a variable filter that is connected between a common terminal and a node and configured to change a passband thereof; a receive switch connected between a receive terminal, from which a reception signal in a first band is output, and the node; and a transmit switch connected between a transmit terminal, to which a transmission signal in a second band different from the first band is input, and the node.

According to a second aspect of the present invention, there is provided a filter circuit including: an acoustic wave resonator; a first capacitor connected in parallel to the acoustic wave resonator; a pathway connected in series to the acoustic wave resonator and connected in parallel to the first capacitor, and in which a second capacitor and a first switch are connected in series; and at least one of a third capacitor and a second switch connected in series to the acoustic wave resonator and connected in parallel to the pathway.

According to a third aspect of the present invention, there is provided a filter circuit including: a variable filter that is connected between a common terminal and a node and configured to change a passband thereof; and a switch that selects and connects one of a receive terminal, from which a reception signal is output, a transmit terminal, to which a transmission signal is input, and a first end of a termination resistor, of which a second end is coupled to a ground, to the node.

According to a fourth aspect of the present invention, there is provided a front end circuit including: a first filter circuit and a second filter circuit that are the above filter circuits of which the common terminals are connected to an antenna terminal.

According to a fifth aspect of the present invention, there is provided a module including: a substrate; and the variable filter, the receive switch, and the transmit switch of the above filter circuit mounted on the substrate.

BRIEF DESCRIPTION OF THE DRAWINGS

FIG. 1 lists the operating band, the transmit frequency, the receive frequency, and the duplex mode of each band regulated in LTE;

FIG. 24 lists exemplary combinations of two bands capable of executing CA or DC;

FIG. 25A and FIG. 25B list exemplary combinations of three and four bands capable of executing CA or DC, respectively;

DETAILED DESCRIPTION

Embodiments will be described hereinafter with reference to the accompanying drawings.

First Embodiment

FIG. 1 lists the operating band, the transmit frequency, the receive frequency, and the duplex mode of each band regulated in LTE. The bands described hereinafter are frequency bands complying with the LTE standard (E-UTRA Operating Band). The operating band indicates a Low Band LB, a Middle Band MB, a High Band HB, or a Very High Band VHB. The duplex mode indicates Frequency Division Duplex (FDD) or Time Division Duplex (TDD). Since the transmission and the reception are divided by frequency in the FDD system, the transmit frequency and the receive frequency do not overlap in a band of the FDD system. Since the transmission and the reception are divided by time in the TDD system, the transmit frequency and the receive frequency overlap in a band of the TDD system.

As illustrated in FIG. 1, LTE bands B5, B8, B12, B13, B17, B20, and B26 through B29 are the Low Band. LTE bands B1 through B4, B25, B34 through B36, and B39 are the Middle Band. LTE bands B7, B30, B38, B40, and B41 are the High Band. LTE bands B22 and B42 are the Very High Band. Hereinafter, the character "LTE" of the LTE band will be omitted. The bands B34 through B36 and B38 through B42 are of the TDD system, while other bands are of the FDD system. In the FDD system, the receive frequency is usually higher than the transmit frequency, but in bands B13 and B20, the transmit frequency is higher than the receive frequency. The band B29 is a band only with a receive frequency.

Figure 2:
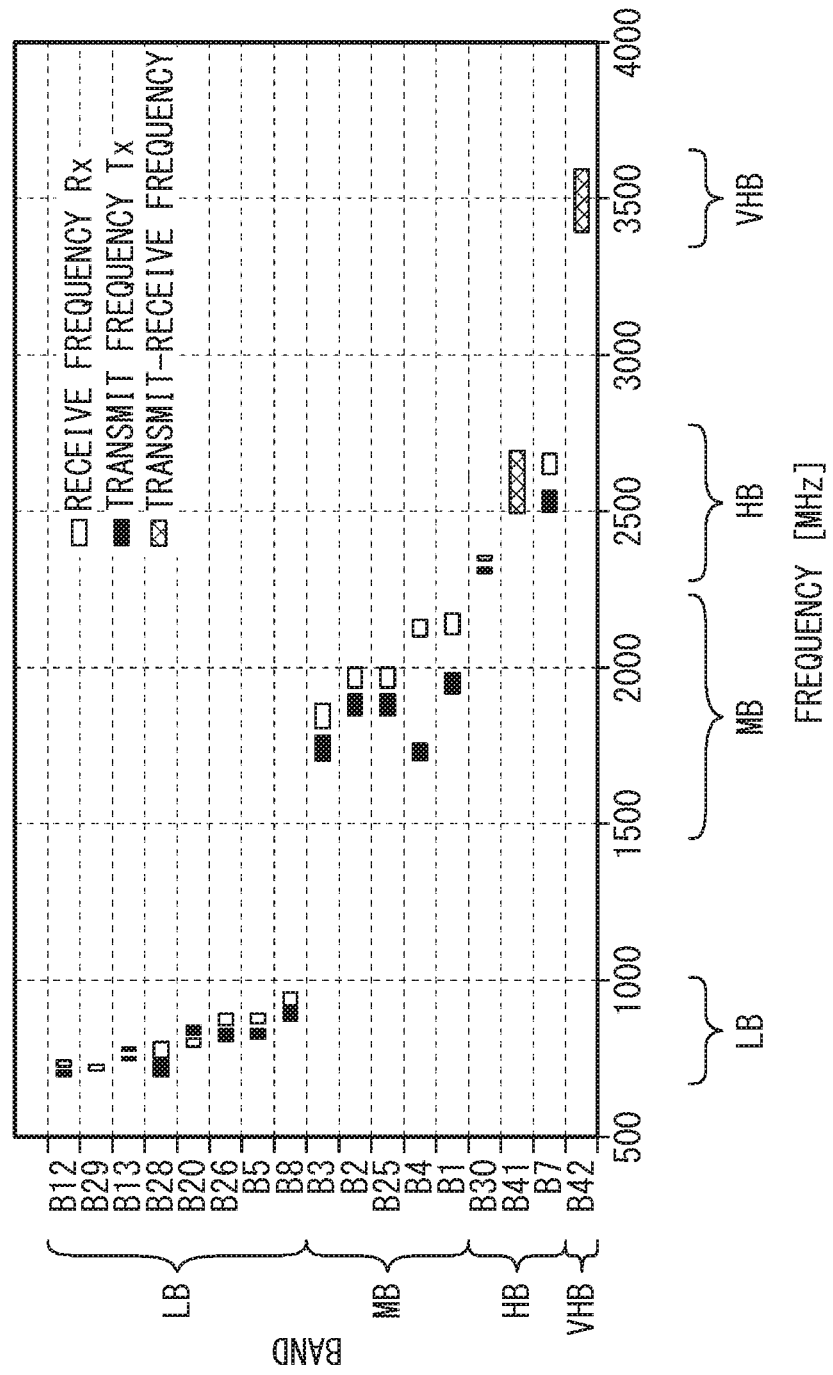
FIG. 2 illustrates the receive frequencies and the transmit frequencies of main bands.

FIG. 2 illustrates the receive frequencies and the transmit frequencies of main bands. As illustrated in FIG. 2, there is a case that the receive frequency and/or the transmit frequency of one band overlaps with the receive frequency and/or the transmit frequency of another band. In addition, there is a case that the receive frequency and/or the transmit frequency of one band is close to the receive frequency and/or the transmit frequency of another band if not overlap. A first embodiment uses a single variable filter as the receive filters and the transmit filter for different bands.

Figure 3:
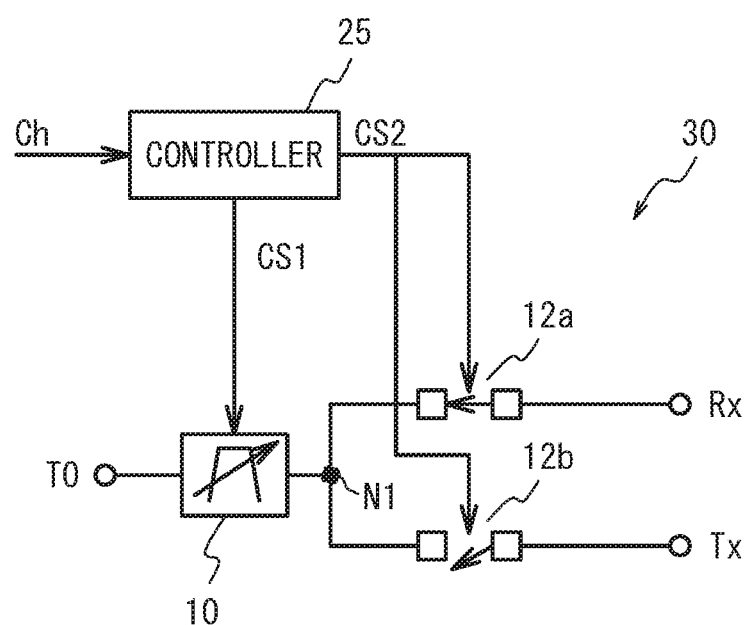
FIG. 3 is a block diagram of a filter circuit in accordance with a first embodiment.

FIG. 3 is a block diagram of a filter circuit in accordance with the first embodiment. A filter circuit 30 includes a variable filter 10, and switches 12a and 12b. The variable filter 10 is connected between a terminal T0 and a node N1. The terminal T0 is a terminal connected to an antenna. The switch 12a is connected between the node N1 and a receive terminal Rx. The receive terminal Rx is a terminal that outputs reception signals in a first band. The switch 12b is connected between the node N1 and a transmit terminal Tx. The transmit terminal Tx is a terminal to which transmission signals in a second band different from the first band are input. The variable filter 10 is a bandpass filter, and changes the passband based on a control signal CS1. The switches 12a and 12b are turned on or off based on a control signal CS2. A controller 25 outputs the control signals CS1 and CS2 based on channel information Ch. The controller 25 is, for example, a processing circuit for processing signals, and may be included in the filter circuit 30 or may not be necessarily included in the filter circuit 30.

Figure 4:
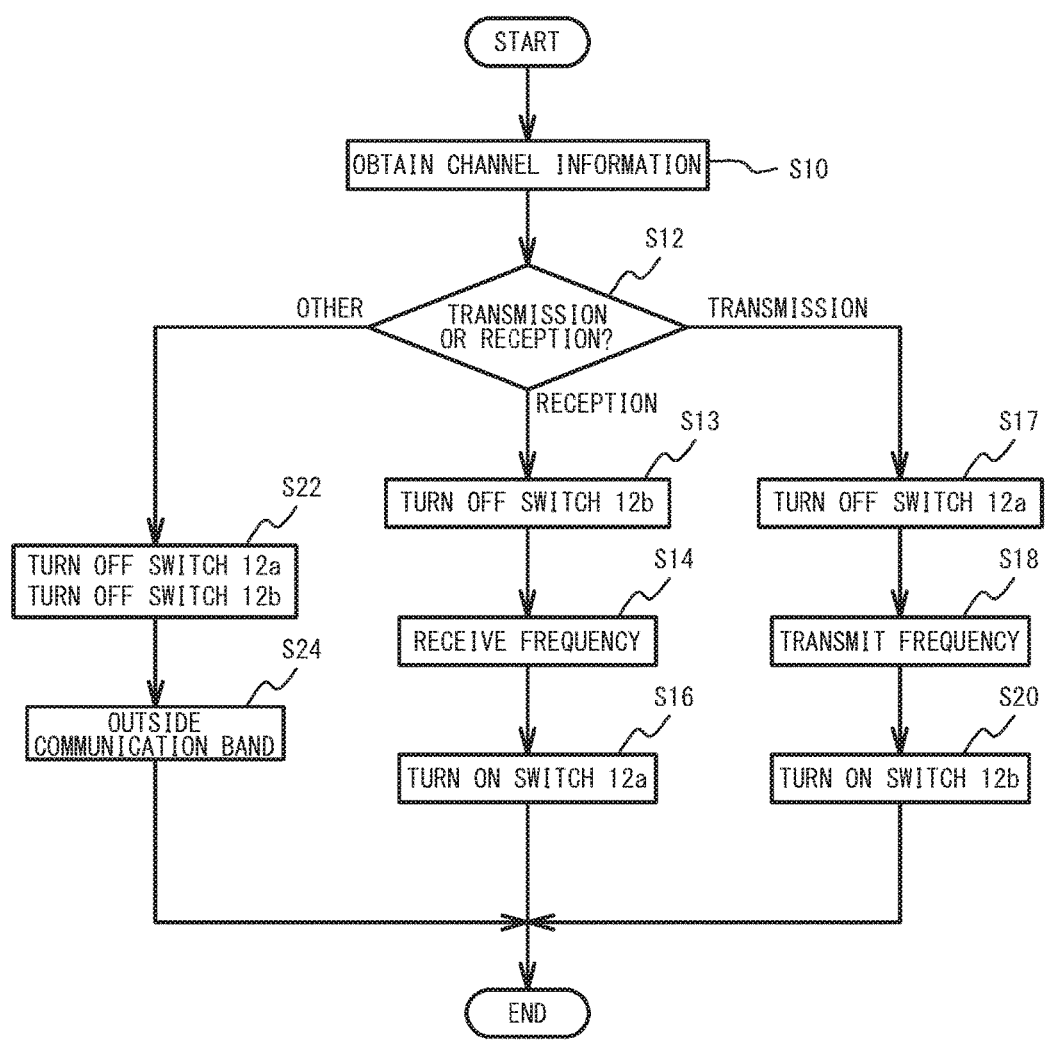
FIG. 4 is a flowchart of the control executed by a controller in the first embodiment.

FIG. 4 is a flowchart of the control executed by the controller in the first embodiment. As illustrated in FIG. 4, the controller 25 obtains the channel information Ch (step S10). The channel information is information indicating which band is to be used for communication. The controller 25 determines, based on the channel information Ch, which of the receive filter for the first band and the transmit filter for the second band the variable filter 10 is to be used as (step S12). For example, when the channel information indicates the use of the first band, the controller 25 determines "reception". When the channel information indicates the use of the second band, the controller 25 determines "transmission". When the channel information indicates the use of none of the first band and the second band, the controller 25 determines "other".

When the determination is "reception" at step S12, the controller 25 turns off the switch 12b (step S13). For example, the controller 25 outputs the control signal CS2 that turns off the switch 12b. The controller 25 sets the passband of the variable filter 10 so that the passband of the variable filter 10 includes the receive frequency of the first band (step S14). For example, the controller 25 outputs the control signal CS1 that instructs the variable filter 10 to change its passband to the receive frequency of the first band. The controller 25 turns on the switch 12a (step S16). For example, the controller 25 outputs the control signal CS2 that turns on the switch 12a. Thereafter, the process is ended. These processes cause reception signals in the first band of high-frequency signals input to the terminal T0 to be output to the receive terminal Rx. High-frequency signals other than the reception signals in the first band are suppressed in the variable filter 10. Signals input to the transmit terminal Tx are not output to the terminal T0.

When the determination is "transmission" at step S12, the controller 25 turns off the switch 12a (step S17). For example, the controller 25 outputs the control signal CS2 that turns off the switch 12a. The controller 25 sets the passband of the variable filter 10 so that the passband of the variable filter 10 includes the transmit frequency of the second band (step S18). For example, the controller 25 outputs the control signal CS1 that instructs the variable filter 10 to change its passband to the transmit frequency of the second band. The controller 25 turns on the switch 12b (step S20). For example, the controller 25 outputs the control signal CS2 that turns on the switch 12b. The process is then ended. These processes cause transmission signals in the second band of high-frequency signals input from the transmit terminal Tx to be output to the terminal T0. High-frequency signals other than transmission signals in the second band are suppressed in the variable filter 10. Signals input to the terminal T0 are not output to the receive terminal Rx.

When the determination is "other" at step S12, the controller 25 turns off the switches 12a and 12b (step S22). For example, the controller 25 outputs the control signal CS2 that turns off the switches 12a and 12b. The controller 25 sets the passband of the variable filter 10 so that the passband of the variable filter 10 does not overlap other communication bands being used for communication (for example, the transmit frequency and the receive frequency of a band being used for communication) (step S24). The step S22 may be omitted. The process is then ended. These processes cause high-frequency signals input to the terminal T0 not to be output to the receive terminal Rx, and cause high-frequency signals input to the transmit terminal Tx not to be output to the transmit terminal Tx.

The switches 12a and 12b of FIG. 3 may be a Single Pole Double Throw (SPDT). In this case, the SPDT connects one of the receive terminal Rx and the transmit terminal Tx to the node N1. When the determination is "other" at step S12 of FIG. 4, the SPDT is connecting one of the receive terminal Rx and the transmit terminal Tx to the node N1. However, since the passband of the variable filter 10 does not overlap the band being used for communication at step S24, the variable filter 10 can be inhibited from allowing unnecessary signals to pass therethrough.

Figure 5:
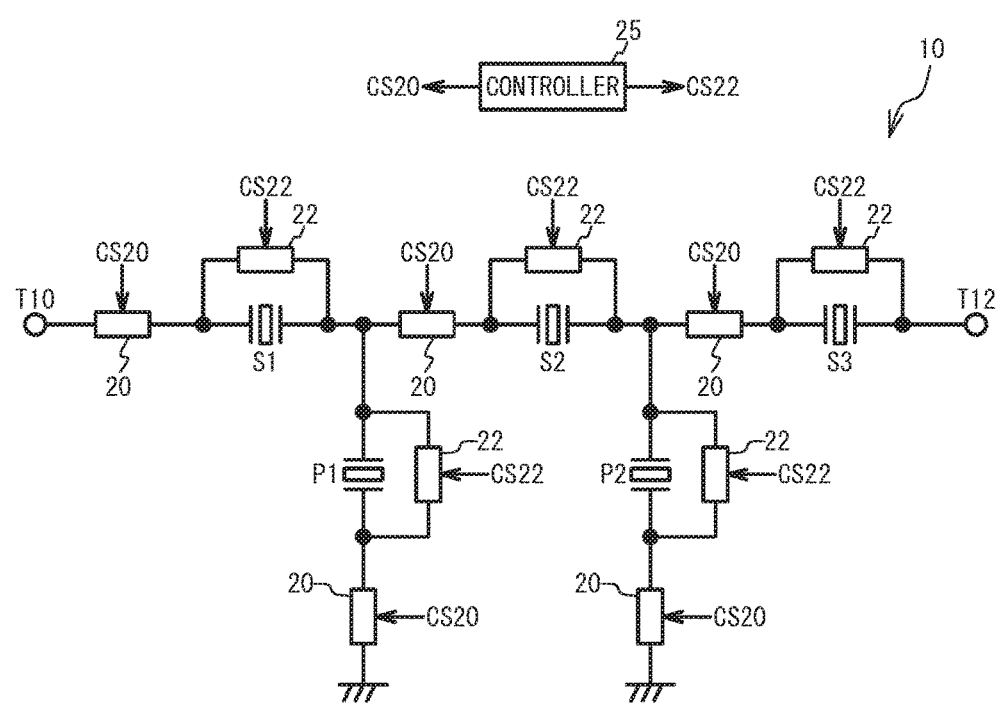
FIG. 5 is a block diagram illustrating an exemplary variable filter in the first embodiment.

FIG. 5 is a block diagram of an exemplary variable filter in the first embodiment. As illustrated in FIG. 5, in the variable filter 10, series resonators S1 through S3 are connected in series between terminals T10 and T12. Parallel resonators P1 and P2 are connected in parallel between the terminals T10 and T12. The terminals T10 and T12 are respectively coupled to, for example, the terminal T0 and the node N1 in FIG. 3. The series resonators S1 through S3 and the parallel resonators P1 and P2 are, for example, acoustic wave resonators such as surface acoustic wave resonators or piezoelectric thin film resonators. An Adjustment circuit 20 is connected in series to each of the series resonators S1 through S3 and the parallel resonators P1 and P2, and an adjustment circuit 22 is connected in parallel to each of the series resonators S1 through S3 and the parallel resonators P1 and P2. The controller 25 outputs control signals CS20 and CS22 as the control signal CS1 to the adjustment circuits 20 and 22, respectively. The adjustment circuits 20 and 22 change impedance based on the control signals CS20 and CS22, respectively.

Figure 6A:
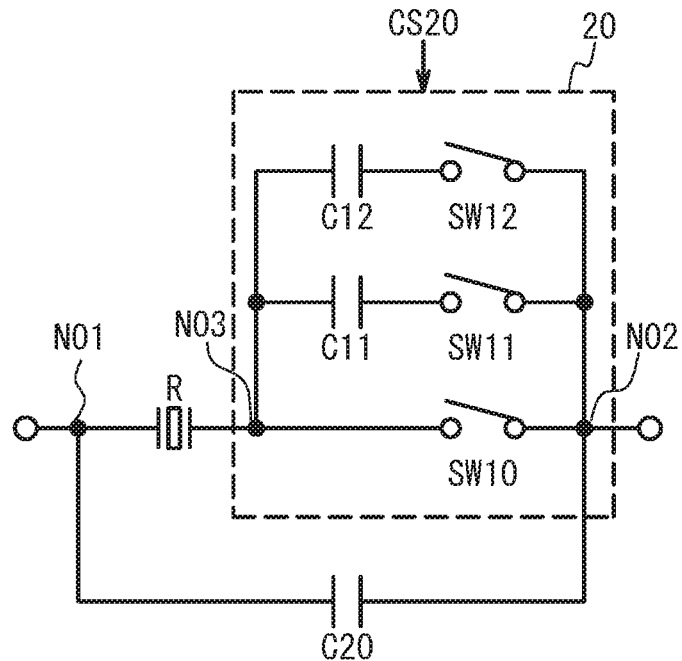
FIG. 6A and FIG. 6B are circuit diagrams illustrating an adjustment circuit in the first embodiment.
Figure 6B:
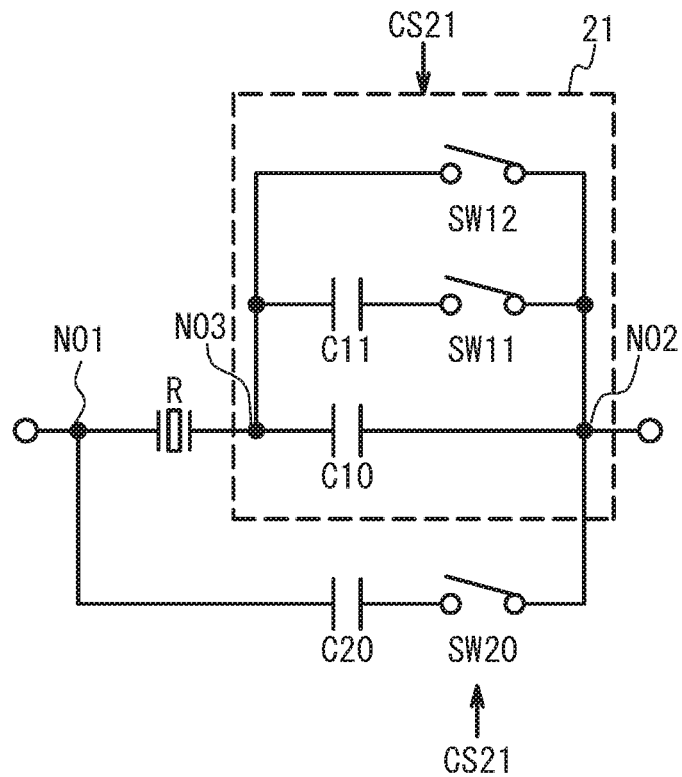

FIG. 6A and FIG. 6B are circuit diagrams illustrating the adjustment circuit in the first embodiment. As illustrated in FIG. 6A, an acoustic wave resonator R is connected between nodes N01 and N03. As the adjustment circuit 20, switches SW10 through SW12 are connected in parallel between the node N03 and a node N02. Between the nodes N03 and N02, a capacitor C11 is connected in series to the switch SW11, and a capacitor C12 is connected in series to the switch SW12. Between the nodes N01 and N02, a capacitor C20 is connected in parallel to the acoustic wave resonator R, the capacitors C11 and C12 and the switches SW10 and SW11. The control signal CS20 is input to the adjustment circuit 20 from the controller 25. Based on the control signal CS20, the switches SW10 through SW12 are individually turned on or off.

When the control signal CS20 turns on the switch SW10 and turns off the switches SW11 and SW12, the adjustment circuit 20 functions as a transmission line. At this time, no capacitor is connected in series to the resonator R. When the control signal CS20 turns on the switch SW11 and turns off the switches SW10 and SW12, the capacitor C11 is connected in series to the resonator R. When the control signal CS20 turns on the switch SW12 and turns off the switches SW10 and SW11, the capacitor C12 is connected in series to the resonator R. When the control signal CS20 turns on the switches SW11 and SW12 and turns off the switch SW10, the capacitors C11 and C12 are connected in series to the resonator R. As described above, the capacitance connected in series to the resonator R can be adjusted with the control signal CS20. The capacitance connected in series to the resonator R can be selected from four different capacitances with use of the switches SW10 through SW12.

Furthermore, the capacitance connected in parallel to the resonator R is a combined capacitance of the capacitances of the capacitor C20 and the adjustment circuit 20. Thus, by changing the capacitance of the adjustment circuit 20, the capacitance connected in parallel to the resonator R can be adjusted to one of four different capacitances.

As illustrated in FIG. 6B, an adjustment circuit 21 includes no capacitor C12 and no switch SW10. A switch SW20 is connected in series to the capacitor C20. The control signal CS21 is input to the adjustment circuit 21 and the switch SW20 from the controller 25. Based on the control signal CS20, the switches SW11, SW12, and SW20 are individually turned on or off. Other structures are the same as those illustrated in FIG. 6A, and the description thereof is omitted.

When the control signal CS21 turns on the switch SW12, the adjustment circuit 21 acts as a transmission line regardless of the state of the switch SW11. At this time, no capacitor is connected in series to the resonator R. When the control signal CS21 turns on the switch SW11 and turns off the switch SW12, the capacitors C11 and C10 are connected in series to the resonator R. When the control signal CS21 turns off the switches SW11 and SW12, the capacitor C10 is connected in series to the resonator R. As described above, the capacitance connected in series to the resonator R can be selected from three different capacitances.

When the control signal CS21 turns on the switch SW20, the capacitance connected in parallel to the resonator R is a combined capacitance of the capacitances of the capacitor C20 and the adjustment circuit 21. When the control signal CS21 turns off the switch SW20, no capacitance is connected in parallel to the resonator R. As described above, the capacitance connected in parallel to the resonator R can be selected from four different capacitances.

Figure 7:
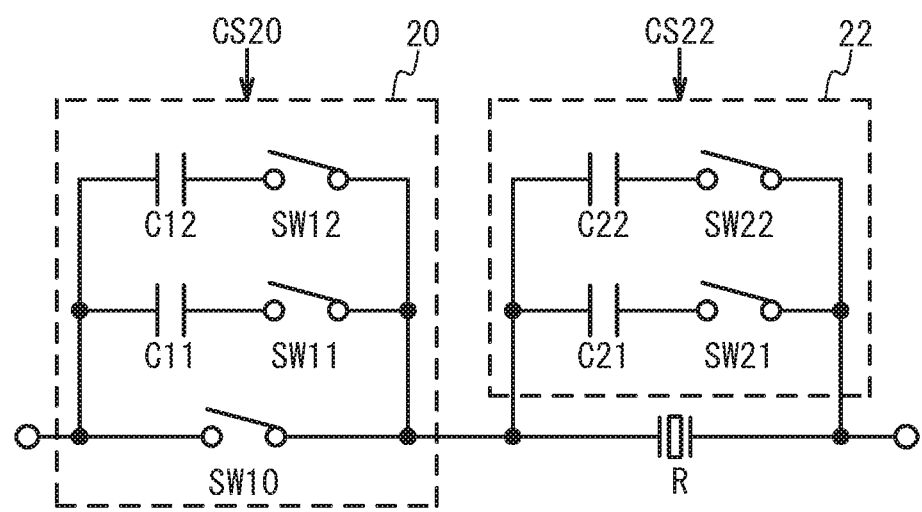
FIG. 7 is a circuit diagram illustrating another exemplary adjustment circuit in the first embodiment.

FIG. 7 is a circuit diagram illustrating another exemplary adjustment circuit in the first embodiment. As illustrated in FIG. 7, the adjustment circuit 20 is connected in series to the resonator R, and the adjustment circuit 22 is connected in parallel to the resonator R. The resonator R corresponds to each of the series resonators 51 through S3 and the parallel resonators P1 and P2 in FIG. 5. In the adjustment circuit 20, a plurality of pathways are connected in parallel. The switch SW10 is connected in series to a first pathway, the capacitor C11 and the switch SW11 are connected in series to a second pathway, and the capacitor C12 and the switch SW12 are connected in series to a third pathway.

When the control signal CS20 turns on the switch SW10 and turns off the switches SW11 and SW12, the adjustment circuit 20 functions as a transmission line. At this time, no capacitor is connected in series to the resonator R. When the control signal CS20 turns on the switch SW11 and turns off the switches SW10 and SW12, the capacitor C11 is connected in series to the resonator R. When the control signal CS20 turns on the switch SW12 and turns off the switches SW10 and SW11, the capacitor C12 is connected in series to the resonator R. When the control signal CS20 turns on the switches SW11 and SW12 and turns off the switch SW10, the capacitors C11 and C12 are connected in series to the resonator R. As described above, the capacitance connected in series to the resonator R can be adjusted by the control signal CS20.

In the adjustment circuit 22, a plurality of pathways are connected in parallel to the resonator R. A capacitor C21 and a switch SW21 are connected in series to a first pathway, and a capacitor C22 and a switch SW22 are connected in series to a second pathway. When the control signal CS22 turns on the switch SW21 and turns off the switch SW22, the capacitor C21 is connected in parallel to the resonator R. When the control signal CS22 turns on the switch SW22 and turns off the switch SW21, the capacitor C22 is connected in parallel to the resonator R. When the control signal CS22 turns on the switches SW21 and SW22, the capacitors C21 and C22 are connected in parallel to the resonator R. As described above, the capacitance connected in parallel to the resonator R can be adjusted by the control signal CS22.

The capacitances connected in series and/or in parallel to the series resonators S1 through S3 and the parallel resonators P1 and P2 in FIG. 5 are adjusted as described in FIG. 7. Accordingly, the resonance characteristics of the series resonators S1 through S3 and the parallel resonators P1 and P2 can be adjusted. Therefore, the pass characteristic of the variable filter 10 can be adjusted.

For example, the resonant frequency can be adjusted by adjusting the capacitance connected in series to the resonator R in FIG. 6A through FIG. 7. The antiresonant frequency can be adjusted by adjusting the capacitance connected in parallel to the resonator R.

Figure 8:
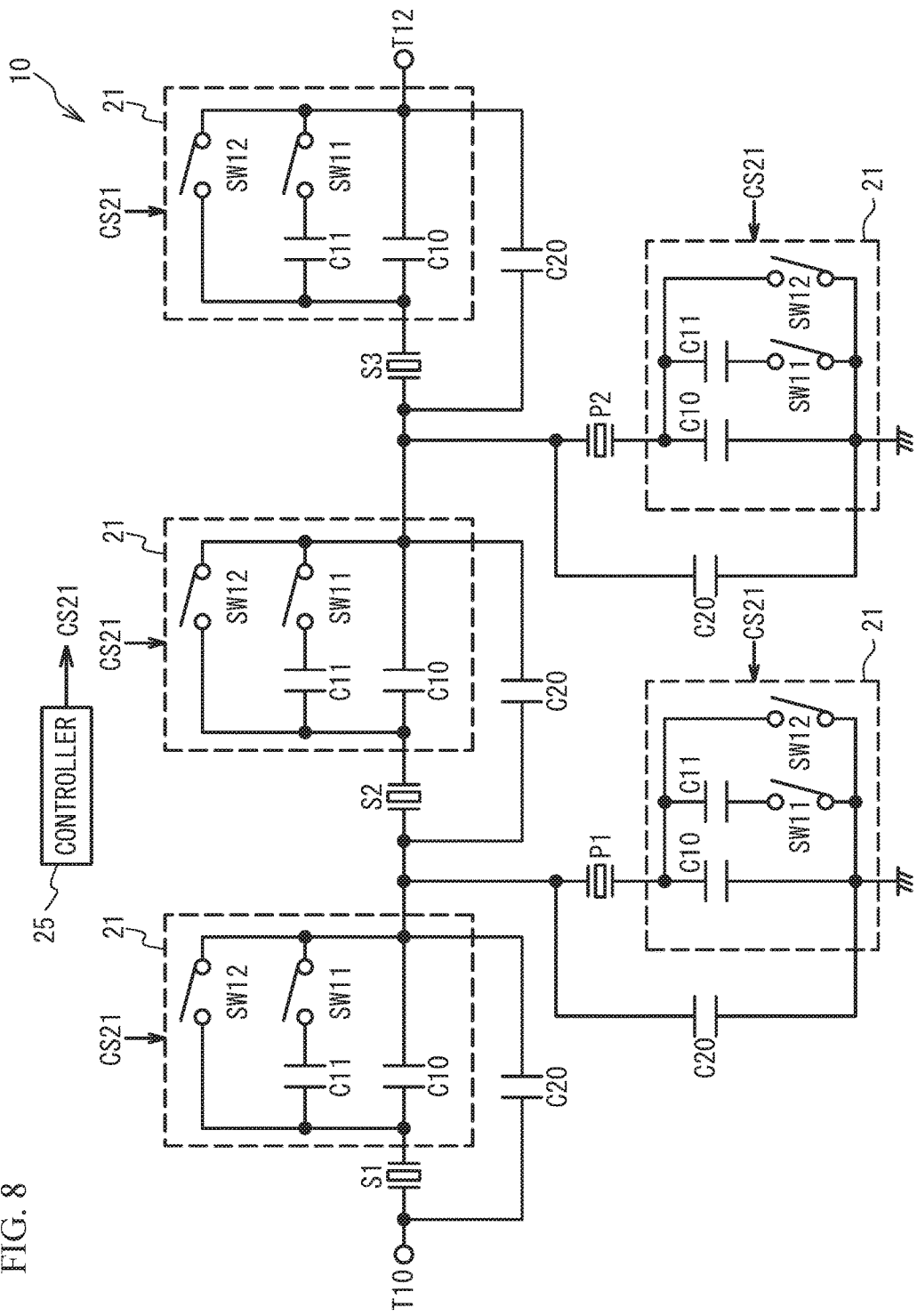
FIG. 8 is a circuit diagram illustrating a filter circuit using the adjustment circuit of FIG. 6B.

FIG. 8 is a circuit diagram illustrating a filter circuit using the adjustment circuit of FIG. 6B. The adjustment circuits 21 of FIG. 6B are connected to the series resonators S1 through S3 and the parallel resonators P1 and P2. The controller 25 outputs the control signals CS21 to the adjustment circuits 21. Other structures are the same as those illustrated in FIG. 5, and the description thereof is omitted.

The characteristics at the high-frequency end of the passband of a ladder-type filter are mainly determined by the resonant frequencies of the series resonators S1 through S3. To change the resonant frequencies of the series resonators S1 through S3, the capacitance of the corresponding adjustment circuit 21 connected to each of the series resonators S1 through S3 is appropriately designed. The high-frequency side skirt characteristic of the passband is mainly determined by the antiresonant frequencies of the series resonators S1 through S3. To change the antiresonant frequencies of the series resonators S1 through S3, the capacitances connected in parallel to the series resonators S1 through S3 are changed. In FIG. 8, the capacitance connected in parallel to each of the series resonators S1 through S3 is a combined capacitance of the capacitors of the adjustment circuit 21 and the capacitor C20. Thus, when the capacitances of the adjustment circuits 21 are changed, the characteristics at the high-frequency end of the series resonators S1 through S3 and the high-frequency side skirt characteristics can be simultaneously changed.

The low-frequency side skirt characteristic of the passband is mainly determined by the resonant frequencies of the parallel resonators P1 and P2. Thus, when the capacitance of the corresponding adjustment circuit 21 connected to each of the parallel resonators P1 and P2 is appropriately designed, the low-frequency side skirt characteristic of the passband can be changed. The characteristics at the low-frequency end of the passband are mainly determined by the antiresonant frequencies of the parallel resonators P1 and P2. The capacitance connected in parallel to each of the parallel resonators P1 and P2 is a combined capacitance of the capacitances of the corresponding adjustment circuit 21 and the capacitor C20. Thus, when the capacitances of the adjustment circuits 21 are changed, the low-frequency side skirt characteristics and the characteristics at the low-frequency end of the parallel resonators P1 and P2 can be simultaneously changed. The frequency of the passband of the ladder-type filter can be changed by the above-described method.

The changing of the characteristics at the high-frequency end of the passband will be described. When the switches SW12 of the adjustment circuits 21 connected to the series resonators S1 through S3 are on, the capacitors C10 and C11 are shorted, and thus, the resonant frequencies of the series resonators S1 through S3 remain unchanged. When the switches SW12 of the adjustment circuits 21 are off and the switches S11 are on, since the capacitors C10 and C11 are added in series to the series resonators S1 through S3, the resonant frequency increases. Accordingly, the high-frequency end of the passband shifts to a higher frequency. At this time, the combined capacitance of the capacitances of the adjustment circuit 21 and the capacitor C20 decreases. Accordingly, the antiresonant frequency increases, and the high-frequency side skirt characteristic also shifts to a higher frequency.

When the switches SW11 and SW12 of the adjustment circuits 21 connected to the series resonators S1 through S3 are off, only the capacitor C10 is added in series to each of the series resonators S1 through S3. Accordingly, the resonant frequency further increases, and the high-frequency end of the passband shifts to a yet higher frequency. At this time, the combined capacitance of the capacitances of the adjustment circuit 21 and the capacitor C20 decreases. Accordingly, the antiresonant frequency also shifts to a yet higher frequency.

The changing of the characteristics at the low-frequency end of the passband will be described. When the switch SW12 of the adjustment circuit 21 connected to each of the parallel resonators P1 and P2 is on, the capacitors C10 and C11 are shorted. Accordingly, the resonant frequencies of the parallel resonators P1 and P2 shift to lower frequencies by the frequency corresponding to the added parallel capacitance of the corresponding capacitor C20.

When the switch SW12 of the adjustment circuit 21 connected to each of the parallel resonators P1 and P2 is off and the switch SW11 is on, the capacitors C10 and C11 are added in series to each of the parallel resonators P1 and P2. Accordingly, the resonant frequency increases, and the low-frequency side skirt characteristic of the passband shifts to a higher frequency. At this time, the combined capacitance of the capacitors of the adjustment circuit 21 and the capacitor C20 decreases. Accordingly, the antiresonant frequency also increases, and the low-frequency end also shifts to a higher frequency.

When the switches SW11 and SW12 of the adjustment circuit 21 connected to each of the parallel resonators P1 and P2 are off, only the capacitor C10 is added in series to each of the parallel resonators P1 and P2. Accordingly, the resonant frequency further increases, and the low-frequency side skirt characteristic of the passband shifts to a yet higher frequency. At this time, the combined capacitance of the capacitors of the adjustment circuit 21 and the capacitor C20 further decreases. Thus, the antiresonant frequency further increases, and the low-frequency end also shifts to a yet higher frequency.

As described above, the filter circuit illustrated in FIG. 8 can change each of the high-frequency end and the low-frequency end of the passband to one of three different frequencies. When the switch SW10 is added to the adjustment circuit 21 as illustrated in FIG. 6A, each of the high-frequency end and the low-frequency end can be changed to one of four different frequencies. In addition, when the switch SW20 is connected in series to the capacitor C20 as illustrated in FIG. 6B, the characteristic at the high-frequency end and the skirt characteristic can be separately changed. In addition, the characteristics at the low-frequency end and the skirt characteristics can be separately changed.

Figure 9:
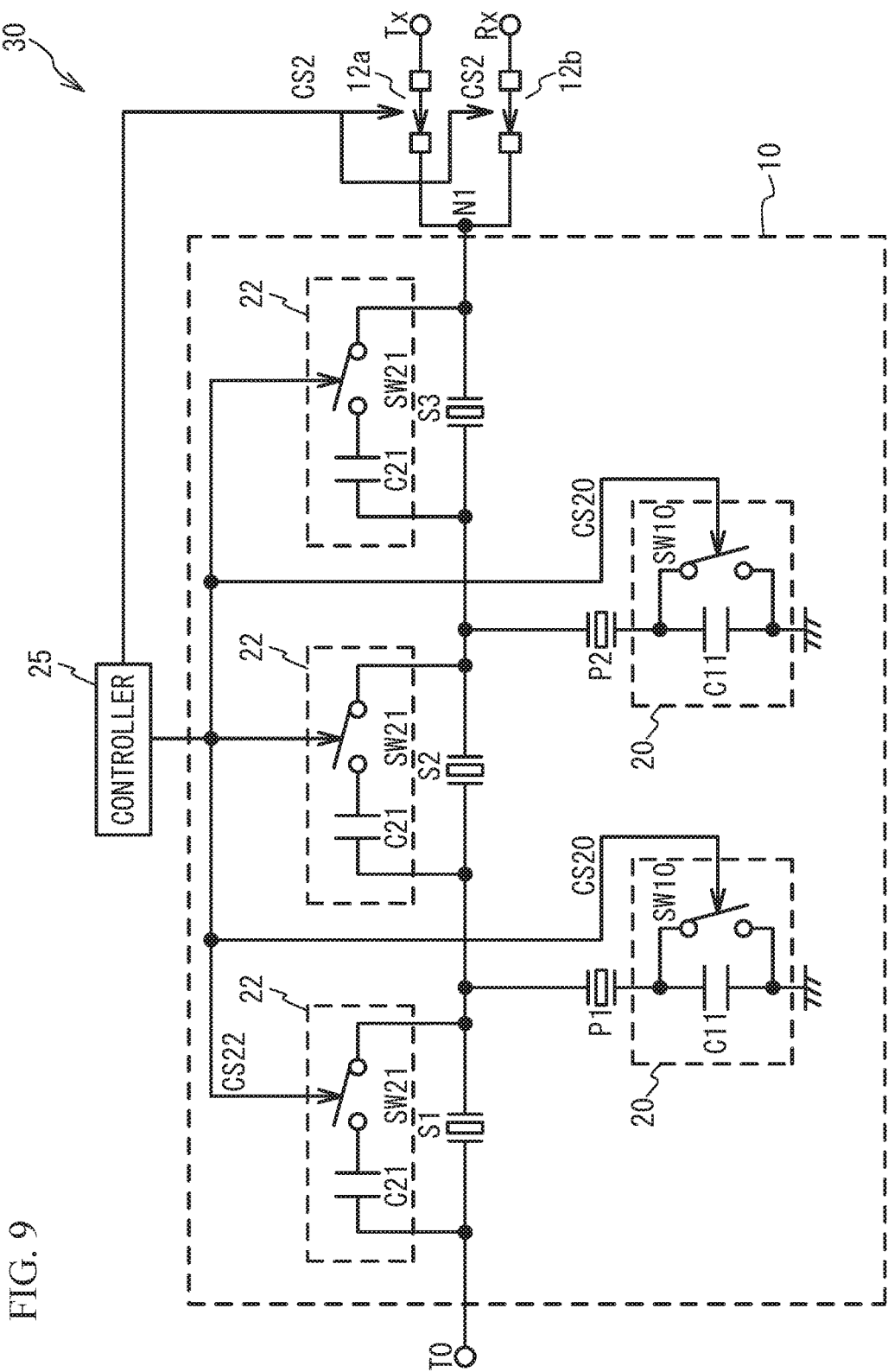
FIG. 9 is a circuit diagram illustrating a filter circuit using the adjustment circuit of FIG. 7.

FIG. 9 is a circuit diagram of a filter circuit using the adjustment circuit illustrated in FIG. 7. As illustrated in FIG. 9, in the filter circuit 30, the adjustment circuit 22 is connected in parallel to each of the series resonators S1 through S3. The adjustment circuit 20 is connected in series to each of the parallel resonators P1 and P2. In a ladder-type filter, the high-frequency side skirt characteristic of the passband is mainly determined by the antiresonant frequency of the series resonator. The low-frequency side skirt characteristic of the passband is mainly determined by the resonant frequency of the parallel resonator. Thus, to change the frequency of the passband, it is only required that the adjustment circuit 22 is connected in parallel to each of the series resonators S1 through S3 and the adjustment circuit 20 is connected in series to each of the parallel resonators P1 and P2.

In the adjustment circuit 22, the capacitor C21 and the switch SW21 are connected in series. Thus, when the switch SW21 is off, the capacitor C21 is not added to each of the series resonators S1 through S3. Accordingly, the antiresonant frequencies of the series resonators S1 through S3 do not change. When the switch SW21 is on, the capacitor C21 is connected in parallel to each of the series resonators S1 through S3. Thus, the antiresonant frequencies of the series resonators S1 through S3 shift to lower frequencies. Accordingly, the high-frequency end of the passband shifts to a lower frequency.

In the adjustment circuit 20, the capacitor C11 and the switch SW10 are connected in parallel. Thus, when the switch SW10 is on, both ends of the capacitor C11 are shorted, and the capacitor C11 is not added to the parallel resonators P1 and P2. Accordingly, the resonant frequencies of the parallel resonators P1 and P2 do not change. When the switch SW10 is off, the capacitor C11 is connected in series to each of the parallel resonators P1 and P2. Accordingly, the resonant frequencies of the parallel resonators P1 and P2 shift to higher frequencies. Therefore, the low-frequency end of the passband shifts to a higher frequency. The frequency of the passband of a ladder-type filter can be changed in the above-described manner.

The series resonator with the lowest antiresonant frequency of the series resonators S1 through S3 mainly affects the high-frequency end of the passband. Thus, the adjustment circuit 22 may be connected in parallel only to the series resonator with the lowest antiresonant frequency. The parallel resonator with the highest resonant frequency of the parallel resonators P1 and P2 mainly affects the low-frequency end of the passband. Thus, the adjustment circuit 20 may be connected in series only to the parallel resonator with the highest resonant frequency.

An exemplary ladder-type filter has been described as the variable filter 10, but the variable filter 10 may be other filters. The number of the series resonators S1 through S3 and the parallel resonators P1 and P2 of the ladder-type filter can be appropriately designed. The adjustment circuits 20 and 22 may adjust inductance instead of capacitance. Alternatively, the adjustment circuits 20 and 22 may adjust both capacitance and inductance.

In the first embodiment, as illustrated in FIG. 3, the variable filter 10 is connected between the terminal T0 (a common terminal) and the node N1. The switch 12a (a receive switch) is connected between the receive terminal Rx that outputs reception signals in the first band and the node N1. The switch 12b (a transmit switch) is connected between the transmit terminal Tx that transmits transmission signals in the second band and the node N1. Since the variable filter 10 functions as the receive filter for the first band and the transmit filter for the second band, the number of filters can be reduced.

As described at steps S14 and S16 in FIG. 4, the controller 25 causes the variable filter 10 to change the passband to the receive frequency of the first band, and turns on the switch 12a and turns off the switch 12b when a reception signal in the first band is received. As described at steps S18 and S20, the controller 25 causes the variable filter 10 to change the passband to the transmit frequency of the second band, and turns off the switch 12a and turns on the switch 12b when a transmission signal in the second band is transmitted. These processes allow the variable filter 10 to be switched to and used as a receive filter for the first band or a transmit filter for the second band. The controller 25 may be included in the filter circuit 30, or may not be necessarily included. The controller 25 preferably switches the switches 12a and 12b after changing the passband of the variable filter 10. This process inhibits unnecessary signals from passing through the variable filter 10 when the band is switched.

Furthermore, when a reception signal in the first band is received, the controller 25 turns off the switch 12b and changes the passband of the variable filter 10 to the receive frequency of the first band, and then turns on the switch 12a as described at steps S13 through S16. When a transmission signal in the second band is transmitted, the controller 25 turns off the switch 12a and changes the passband of the variable filter 10 to the transmit frequency of the second band, and then turns on the switch 12b as described at steps S17 through S20. These processes protect the filter circuit.

Furthermore, as illustrated in FIG. 6A through FIG. 8, the capacitor C20 (a first capacitor) is connected in parallel to the acoustic wave resonator R. In the pathway connected in series to the acoustic wave resonator R and connected in parallel to the capacitor C20, the capacitor C11 (a second capacitor) and the switch SW11 (a first switch) are connected in series. At least one of the capacitor C12 (a third capacitor) and the switch SW10 (a second switch) is connected in series to the resonator R and connected in parallel to this pathway. This structure allows the resonant frequency and the antiresonant frequency of the acoustic wave resonator R to be simultaneously changed by turning on or off the switches SW11 and SW12. Accordingly, the filter circuit can be reduced in size compared to, for example, FIG. 7.

The receive frequency of the first band and the transmit frequency of the second band preferably partially overlap in frequency. This configuration makes the switching of the passband of the variable filter 10 easier.

In the FDD system, the transmit frequency and the receive frequency do not overlap. In addition, the reception and the transmission are simultaneously performed. Thus, it is difficult for a single variable filter to function as both a transmit filter and a receive filter. Thus, when at least one of the first band and the second band is of the FDD system, a single variable filter is configured to function as a receive filter for one band and a transmit filter for another band. This configuration can reduce the number of filters.

Second Embodiment

Figure 10:
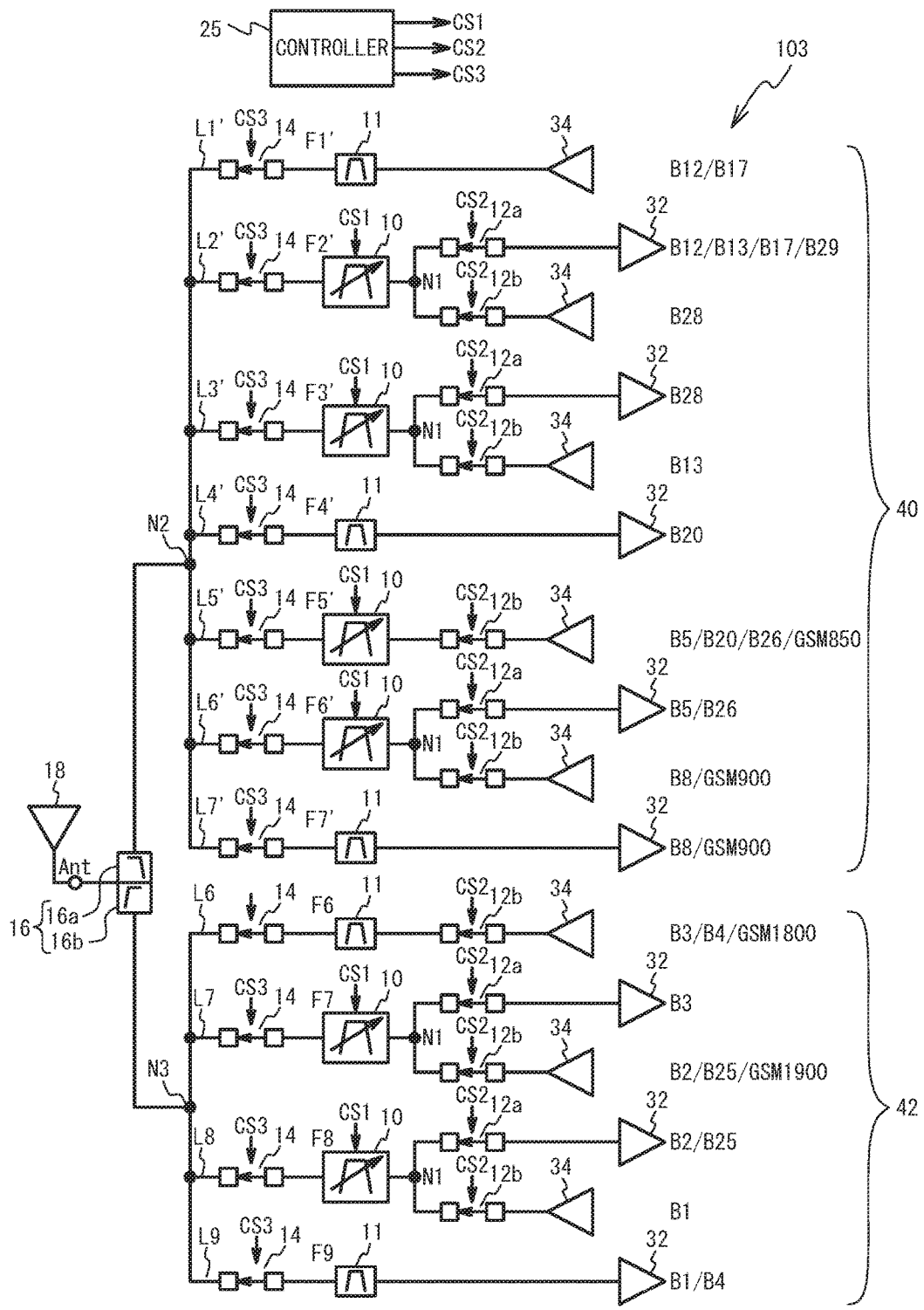
FIG. 10 is a circuit diagram of a front end circuit in accordance with a second embodiment.

A second embodiment is an exemplary front end circuit used for a terminal for mobile communication. FIG. 10 is a circuit diagram of a front end circuit in accordance with the second embodiment. As illustrated in FIG. 10, a front end circuit 103 includes a diplexer 16, a low band circuit 40, and a middle band circuit 42. The diplexer 16 includes a low-pass filter (LPF) 16a and a high-pass filter (HPF) 16b. The LPF 16a is connected between an antenna terminal Ant connected to an antenna 18 and a node N2. The HPF 16b is connected between the antenna terminal Ant and a node N3.

The low band circuit 40 includes a plurality of pathways L1' through L7' connected to the node N2. The middle band circuit 42 includes a plurality of pathways L6 through L9 connected to the node N3. Filters F1' through F7' and F6 through F9, each of which is the variable filter 10 or a filter 11, are respectively connected in series to the pathways L1' through L7' and L6 through L9. The filter 11 is the bandpass filter with a fixed frequency. Switches 14 are connected between the filters F1' through F7' and F6 through F9 and the node N2 or N3. Switches 12a are connected between the filters F1' through F7' and F6 through F9 and low noise amplifiers (LNA) 32. The LNA 32 amplifies reception signals. Switches 12b are connected between the filters F1' through F7' and F6 through F9 and power amplifiers (PA) 34. The PA 34 amplifies transmission signals.

In the front end circuit 103, the low band circuit 40 includes the pathways L1' through L7' connected to the node N2. The filters F2', F3', and F6' and the switches 12a and 12b in the pathways L2', L3', and L6' are the filter circuits 30 of the first embodiment.

The pathway L1' is a pathway for transmission signals in band B12 or B17. The pathway L2' is a pathway for reception signals in band B12, B13, B17, or B29 and transmission signals in band B28. The pathway L3' is a pathway for reception signals in band B28 and transmission signals in band B13. The pathway L4' is a pathway for reception signals in band B20. The pathway L5' is a pathway for transmission signals in band B5, B20, or B26 or Global System for Mobile communications (GSM: registered trademark) 850. The pathway L6' is a pathway for reception signals in band B5 or B26 and transmission signals in band B8 or GSM 900. The pathway L7' is a pathway for reception signals in band B8 or GSM 900.

The pathway L6 is a pathway for transmission signals in band B3 or B4, or GSM 1800. The pathway L7 is a pathway for reception signals in band B3 and transmission signals in band B2 or B25, or GSM 1900. The pathway L8 is a pathway for reception signals in band B2 or B25 and transmission signals in band B1. The pathway L9 is a pathway for reception signals in band B1 or B4.

The controller 25 outputs the control signal CS1 to the variable filter 10, the control signal CS2 to the switches 12a and 12b, and a control signal CS3 to the switch 14.

Figure 11:
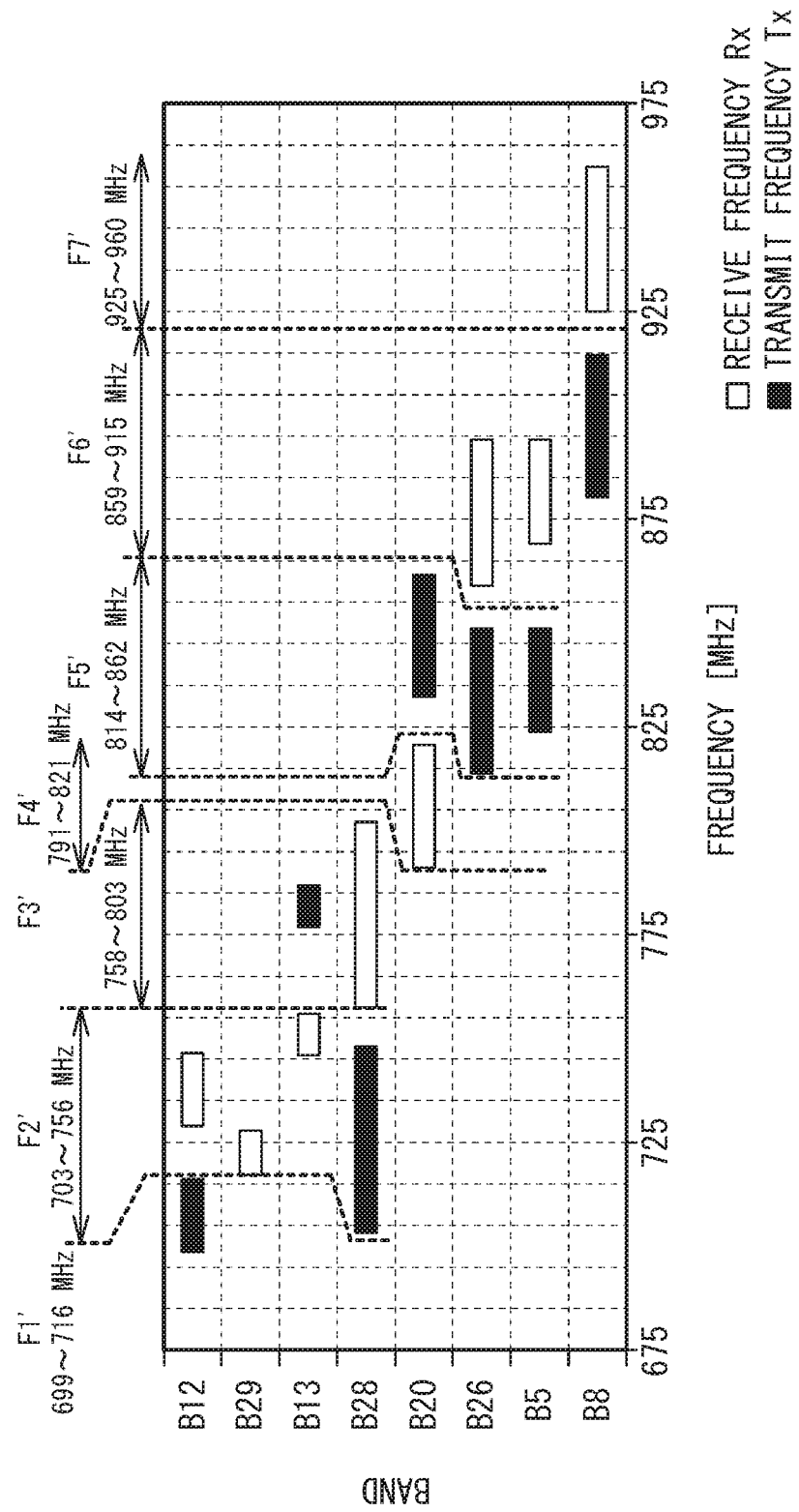
FIG. 11 illustrates the frequency bands of filters for a Low Band in the second embodiment.

FIG. 11 illustrates the frequency bands of filters for the Low Band in the second embodiment. The filter F1' supports 699 MHz to 716 MHz, and the passband thereof corresponds to the transmit frequency of band B12. The filter F2' supports 703 MHz to 756 MHz, and changes its passband to one of the transmit frequency of band B28 and the receive frequencies of bands B12, B29, and B13. The filter F3' supports 758 MHz to 803 MHz, and changes its passband to one of the transmit frequency of band B13 and the receive frequency of band B28. The filter F4' supports 791 MHz to 821 MHz, and the passband thereof corresponds to the receive frequency of band B20. The filter F5' supports 814 MHz to 862 MHz, and changes its passband to one of the transmit frequencies of bands B20, B26, and B5. The filter F6' supports 859 MHz to 915 MHz, and changes its passband to one of the receive frequencies of bands B26 and B5 and the transmit frequency of band B8. The filter F7' supports 925 MHz to 960 MHz, and the passband thereof corresponds to the receive frequency of band B8.

Figure 12:
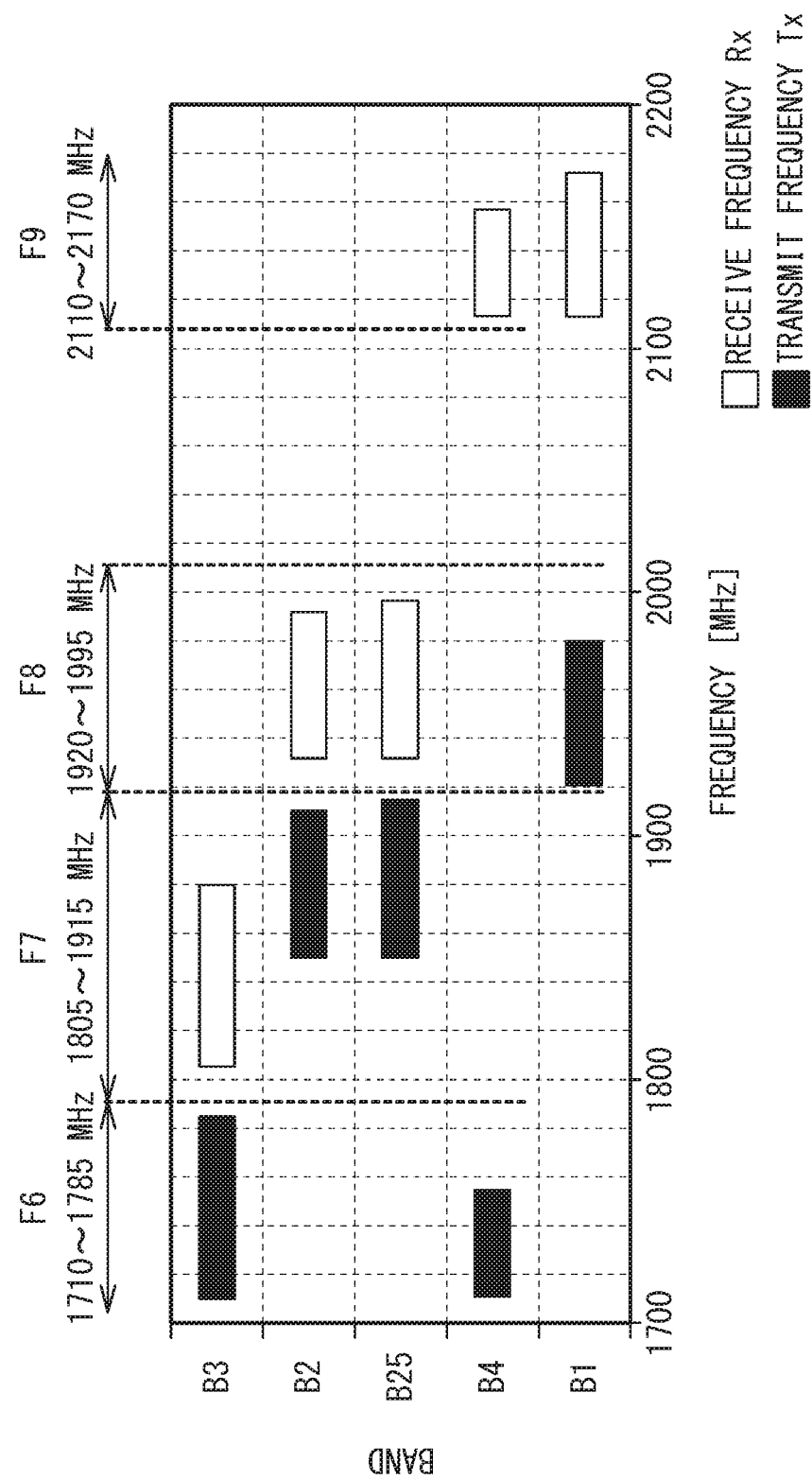
FIG. 12 illustrates the frequency bands of filters for a Middle Band in the second embodiment.

FIG. 12 illustrates the frequency bands of filters for the Middle Band in the second embodiment. In FIG. 12, the receive frequency and the transmit frequency of each band are illustrated. The filter F6 supports 1710 MHz to 1785 MHz, and changes its passband to one of the transmit frequencies of bands B3 and B4. The filter F7 supports 1805 MHz to 1915 MHz, and changes its passband to one of the transmit frequencies of bands B2 and B25 and the receive frequency of band B3. The filter F8 supports 1920 MHz to 1995 MHz, and changes its passband to one of the transmit frequency of band B1 and the receive frequencies of bands B2 and B25. The filter F9 supports 2110 MHz to 2170 MHz, and changes its passband to one of the receive frequencies of bands B4 and B1.

Figure 13:
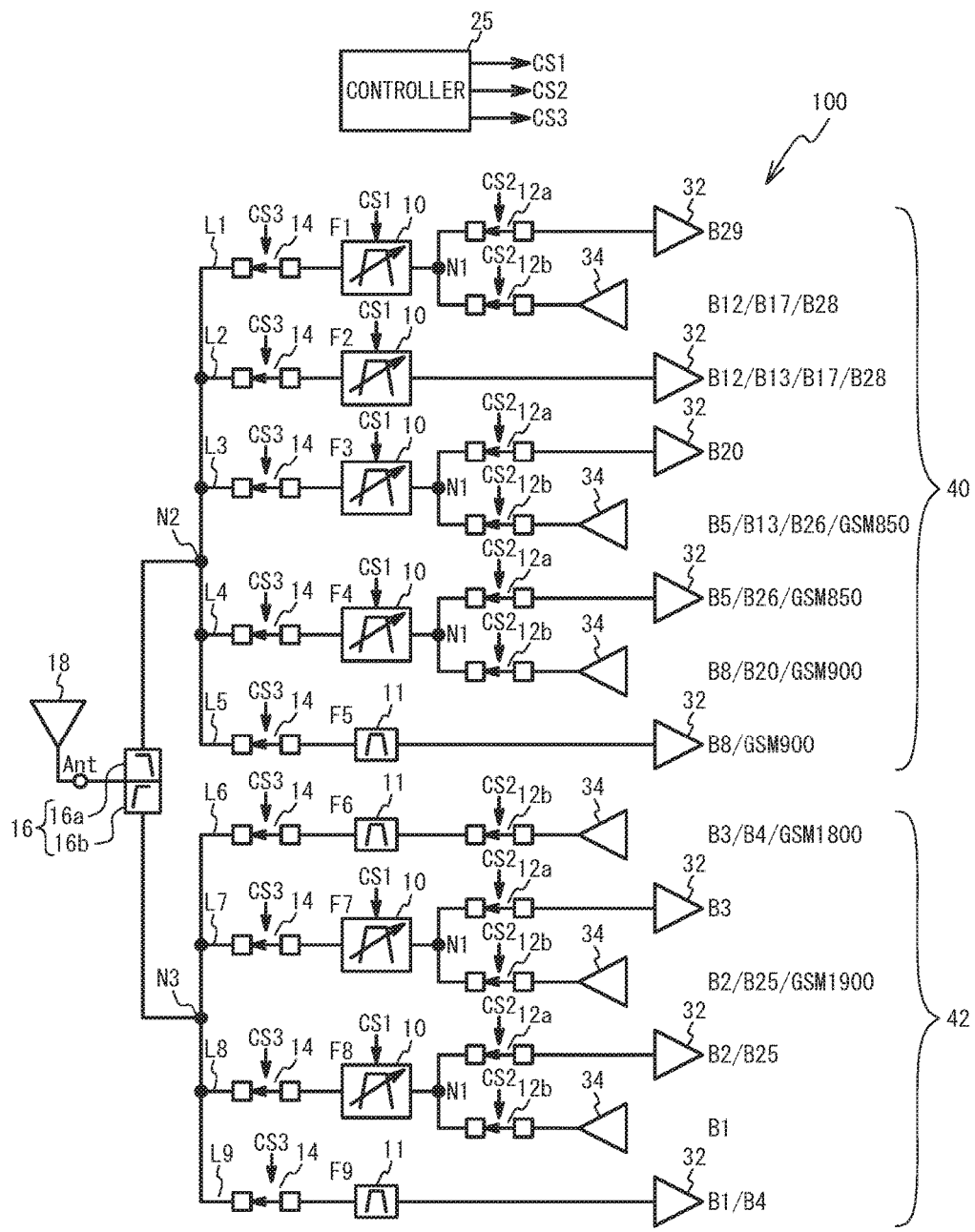
FIG. 13 is a circuit diagram of a front end circuit in accordance with a first variation of the second embodiment.

FIG. 13 is a circuit diagram of a front end circuit in accordance with a first variation of the second embodiment. As illustrated in FIG. 13, in a front end circuit 100, the low band circuit 40 includes a plurality of pathways L1 through L5 connected to the node N2. Filters F1, F3, and F4 and the switches 12a and 12b in the pathways L1, L3, and L4 are the filter circuit 30 of the first embodiment.

The pathway L1 is a pathway for reception signals in band B29 and transmission signals in band B12, B17, or B28. The pathway L2 is a pathway for reception signals in band B12, B13, B17, or B28. The pathway L3 is a pathway for reception signals in band B20 and transmission signals in band B5, B13 or B26 or GSM 850. The pathway L4 is a pathway for reception signals in band B5 or B26 or GSM 850 and transmission signals in band B8 or B20 or GSM 900. The pathway L5 is a pathway for reception signals in band B8 or GSM 900.

Figure 14:
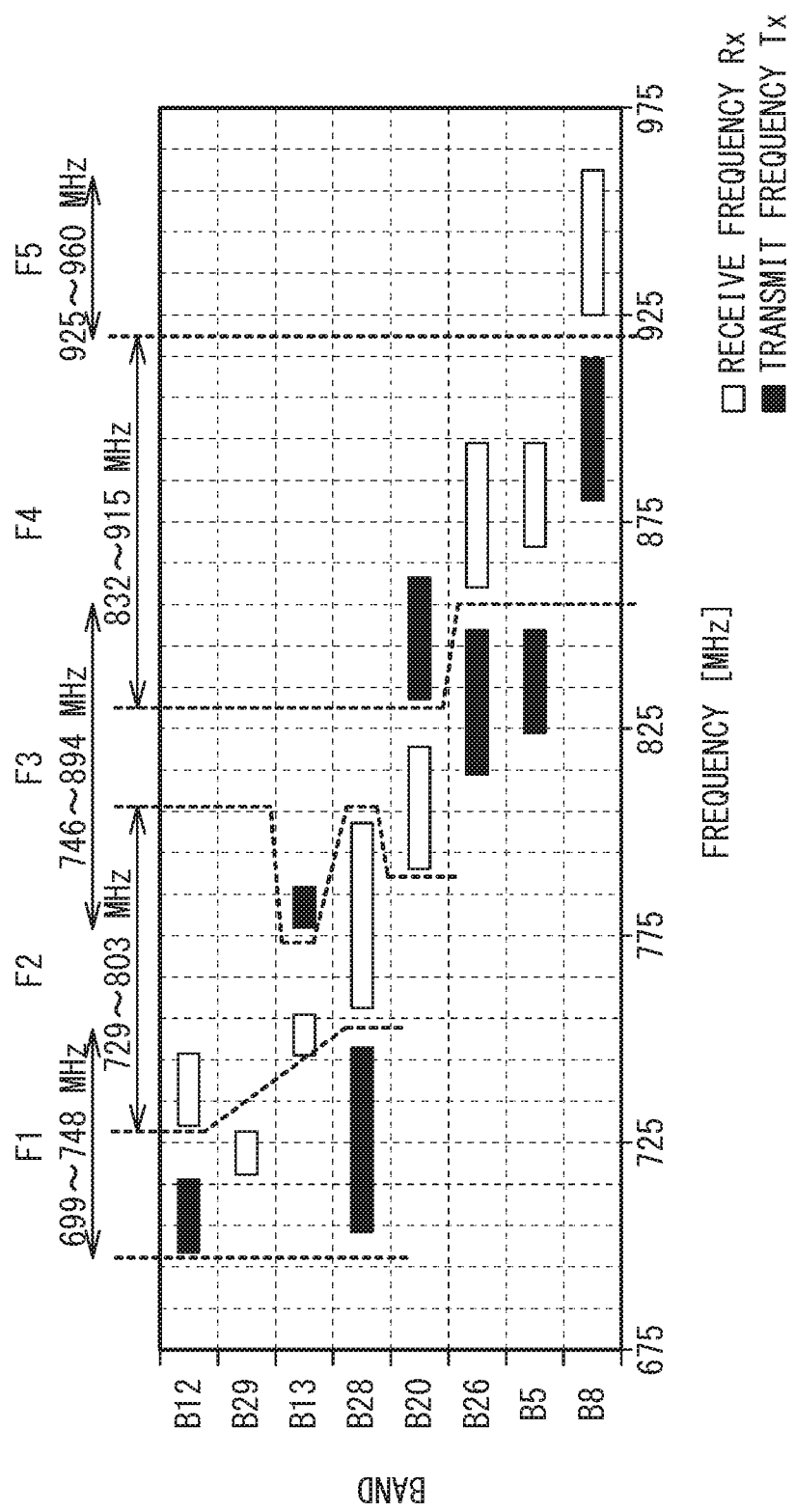
FIG. 14 illustrates the frequency bands of filters for a Low Band in the first variation of the second embodiment.

FIG. 14 illustrates the frequency bands of filters for the Low Band in the second embodiment. In FIG. 14, the receive frequency and the transmit frequency of each band are presented. The filter F1 supports 699 MHz to 748 MHz, and changes its passband to one of the transmit frequencies of bands B12 and B28 and the receive frequency of band B29. The filter F2 supports 729 MHz to 803 MHz, and changes its passband to one of the receive frequencies of bands B12, B13, and B28. The filter F3 supports 746 MHz to 894 MHz, and changes its passband to one of the transmit frequencies of bands B13, B26, and B5 and the receive frequency of band B20. The filter F4 supports 832 MHz to 915 MHz, and changes its passband to one of the transmit frequencies of bands B20 and B8 and the receive frequencies of bands B26 and B5. The filter F5 supports 925 MHz to 960 MHz, and the passband thereof corresponds to the receive frequency of band B8.

The middle band circuit 42 is the same as that of the second embodiment, and the description thereof is omitted. As in the second embodiment and the first variation of the second embodiment, the number of pathways and whether the filter is the variable filter 10 or the filter 11 can be freely designed.

A description will be given of an example that executes Carrier Aggregation (CA) or Dual Connectivity (DC) by using the front end circuit 100 in accordance with the first variation of the second embodiment. CA is a technology that achieves high-speed transmission by performing transmission and reception to and from a base station by using multiple bands at the same time. The number of base stations communicated with is one or plural. DC is a technology that performs transmission and reception to and from a plurality of base stations at the same time.

Figure 15:
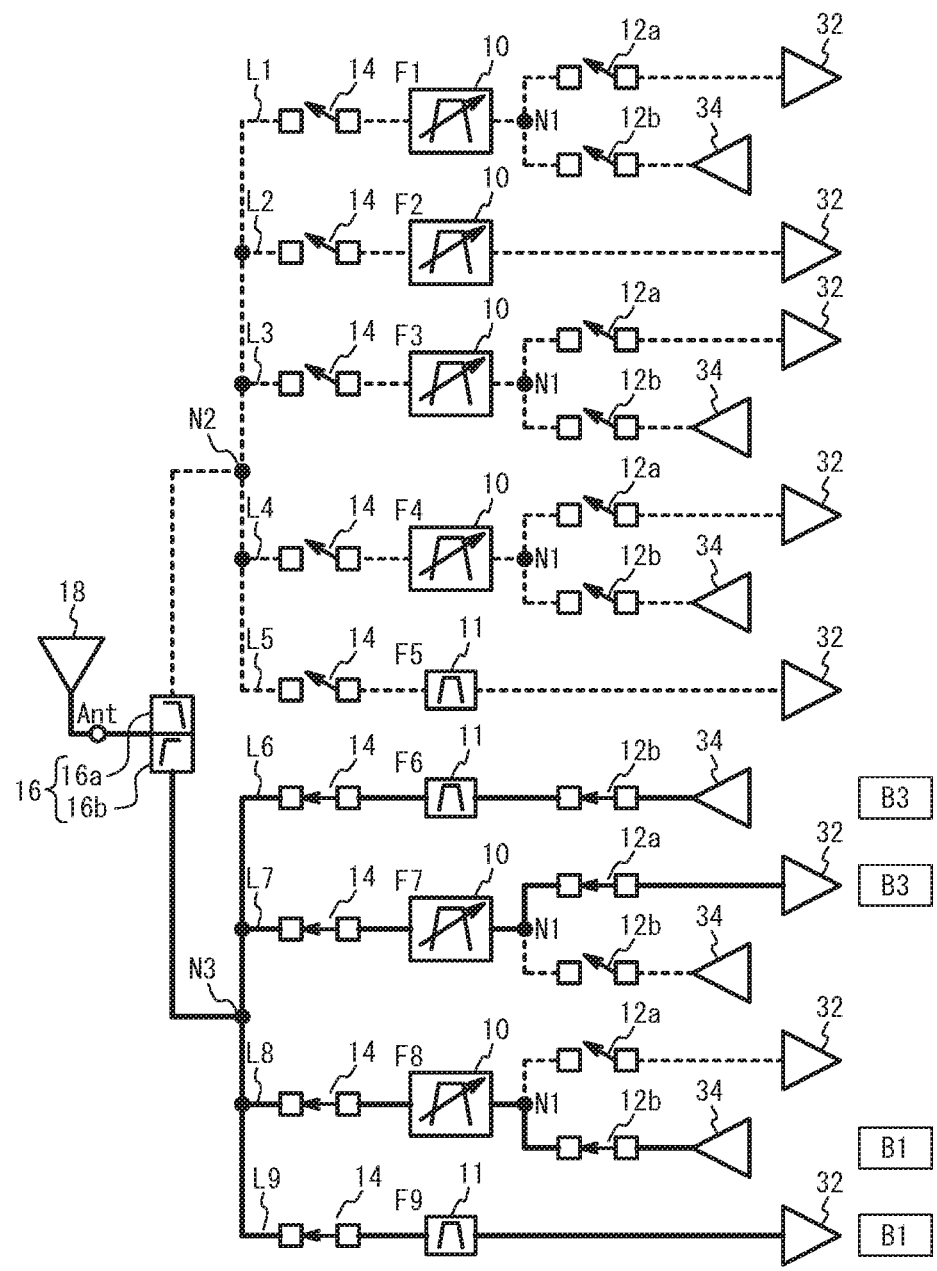
FIG. 15 illustrates an example that executes CA with two bands of the Middle Band by using the front end circuit of the first variation of the second embodiment.

FIG. 15 illustrates an example that executes CA with two bands of the Middle Band by using the front end circuit of the first variation of the second embodiment. In FIG. 15, the solid lines indicate pathways that are executing transmission and reception, and the dotted lines indicate pathways that are not executing transmission or reception. The same applied to the drawings hereinafter. As illustrated in FIG. 15, the switches 14 and 12b in the pathway L6, the switches 14 and 12a in the pathway L7, the switches 14 and 12b in the pathway L8, and the switch 14 in the pathway L9 are turned on, and other switches 14, 12a, and 12b are turned off. The passband of the filter F7 is set to the receive frequency of band B3. The passband of the filter F8 is set to the transmit frequency of band B1. This setting allows for transmission and reception using bands B1 and B3 at the same time.

Figure 16:
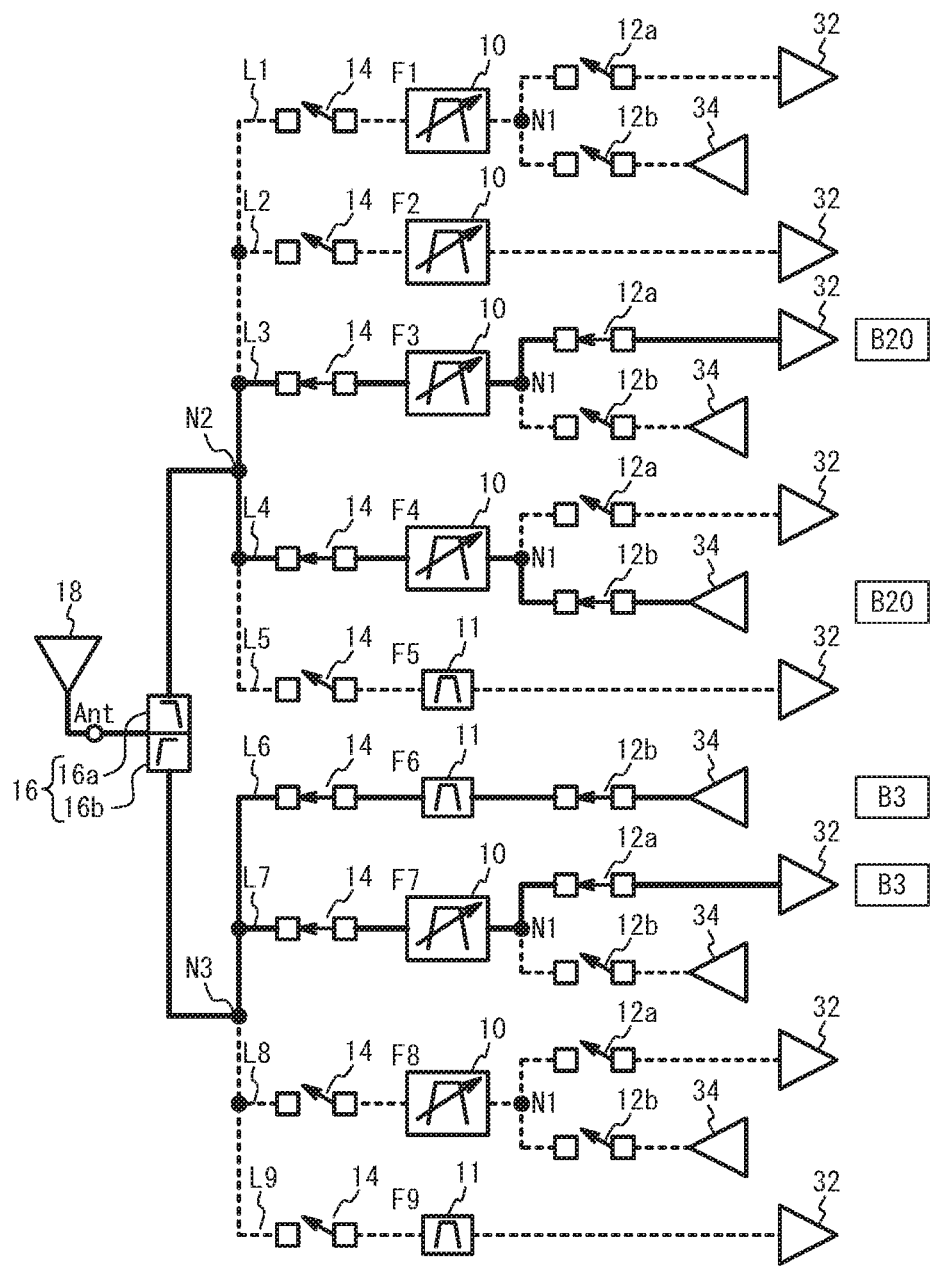
FIG. 16 illustrates an example that executes CA with two bands of the Low Band and the Middle Band by using the front end circuit of the first variation of the second embodiment.

FIG. 16 illustrates an example that executes CA with two bands of the Low Band and the Middle Band by using the front end circuit of the first variation of the second embodiment. As illustrated in FIG. 16, the switches 14 and 12a in the pathway L3, the switches 14 and 12b in the pathway L4, the switches 14 and 12b in the pathway L6, and the switches 14 and 12a in the pathway L7 are turned on, and other switches 14, 12a, and 12b are turned off. The passband of the filter F3 is set to the receive frequency of band B20. The passband of the filter F4 is set to the transmit frequency of band B20. The passband of the filter F7 is set to the receive frequency of band B3. This setting allows for transmission and reception using bands B3 and B20 at the same time.

Figure 17:
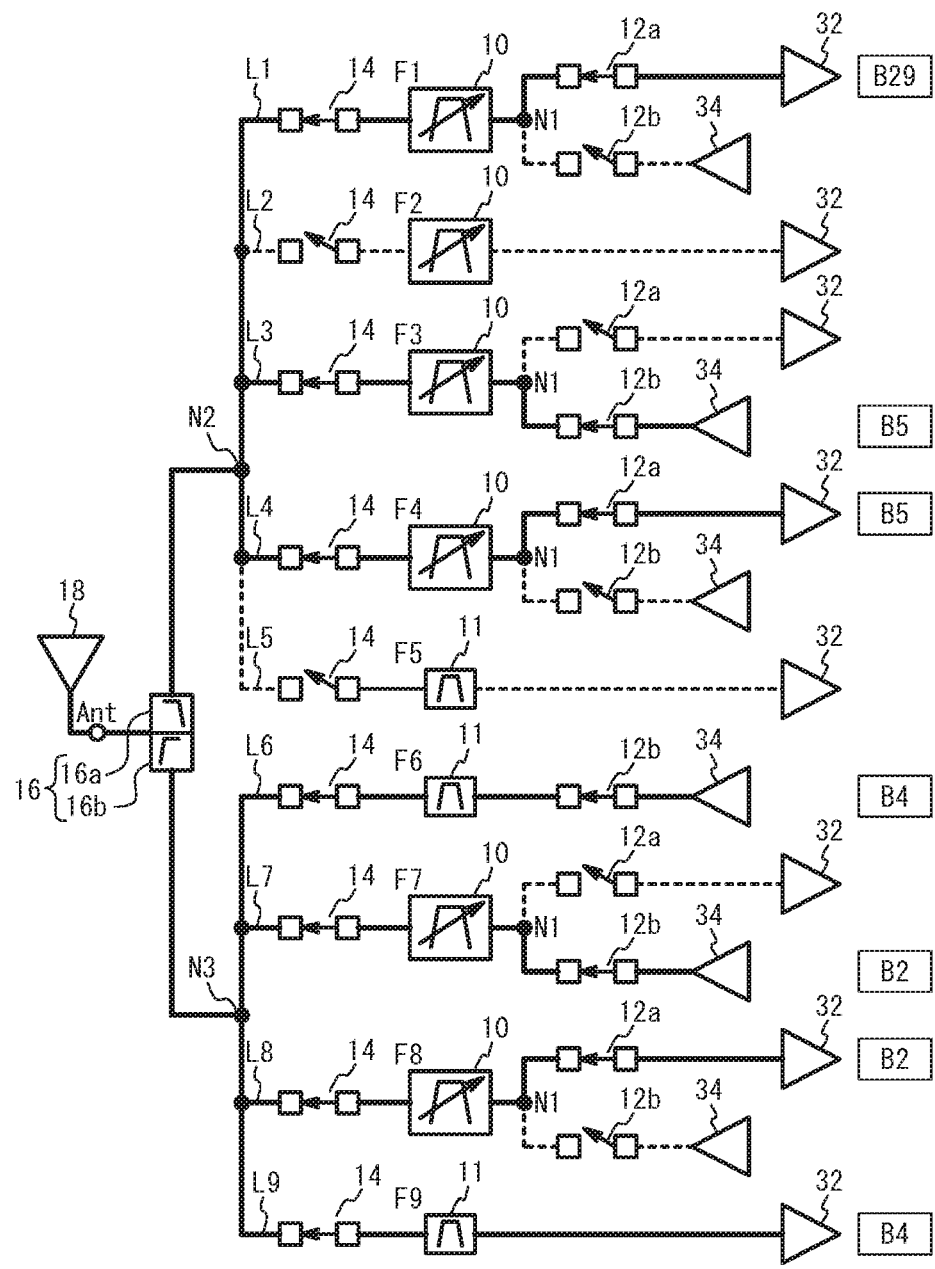
FIG. 17 illustrates an example that executes CA with four bands of the Low Band and the Middle Band by using the front end circuit of the first variation of the second embodiment.

FIG. 17 illustrates an example that executes CA with four bands of the Low Band and the Middle Band by using the front end circuit of the first variation of the second embodiment. As illustrated in FIG. 17, the switches 14 and 12a in the pathway L1, the switches 14 and 12b in the pathway L3, the switches 14 and 12a in the pathway L4, the switches 14 and 12b in the pathway L6, the switches 14 and 12b in the pathway L7, the switches 14 and 12a in the pathway L8, and the switch 14 in the pathway L9 are turned on, and other switches 14, 12a, and 12b are turned off. The passband of the filter F1 is set to the receive frequency of band B29. The passband of the filter F3 is set to the transmit frequency of band B5. The passband of the filter F4 is set to the receive frequency of band B5. The passband of the filter F7 is set to the transmit frequency of band B2. The passband of the filter F8 is set to the receive frequency of band B2. This setting allows for transmission and reception using bands B2, B4, B5, and B29 at the same time.

Figure 18:
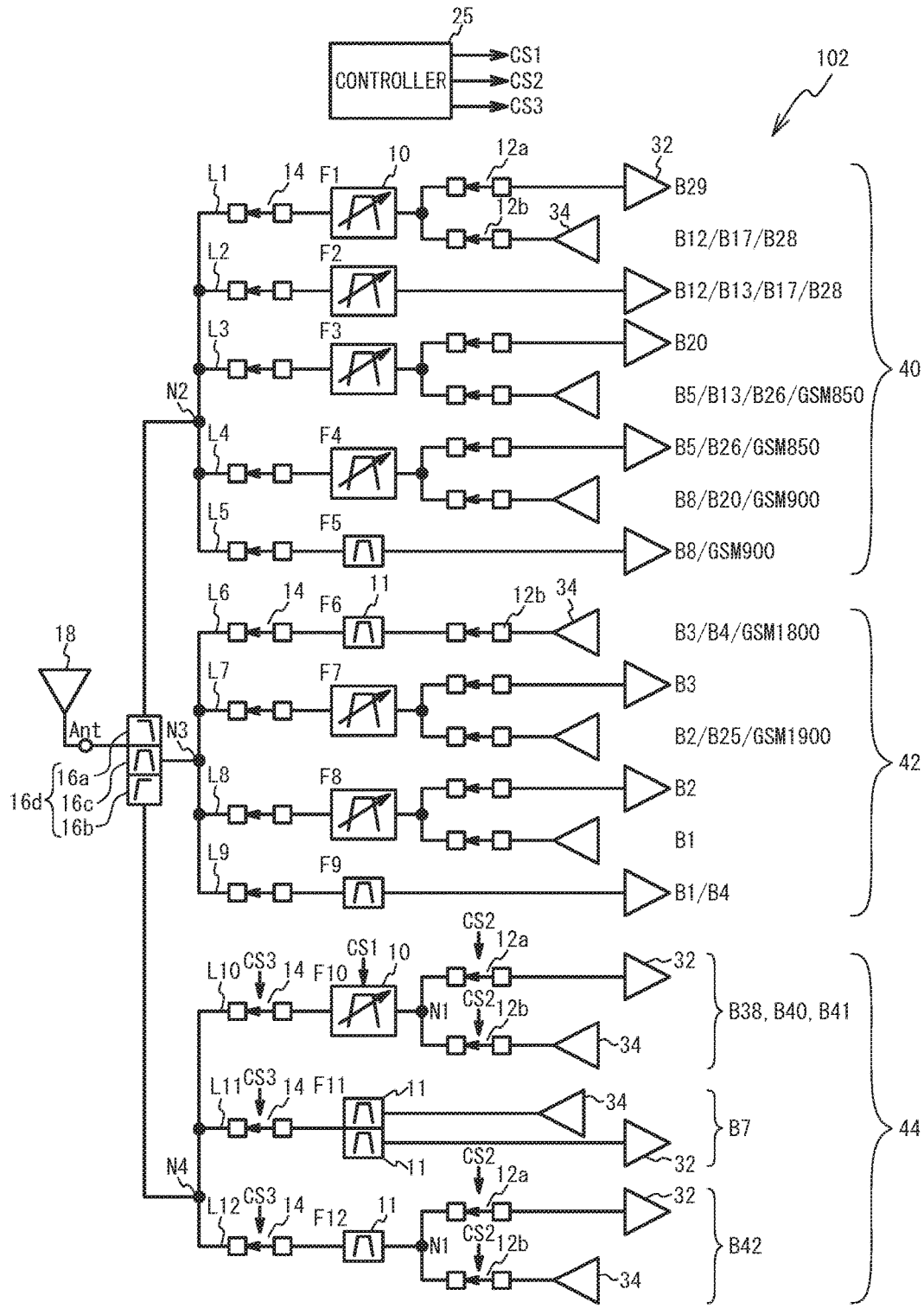
FIG. 18 is a circuit diagram of a front end circuit in accordance with a second variation of the second embodiment.

FIG. 18 is a circuit diagram of a front end circuit in accordance with a second variation of the second embodiment. As illustrated in FIG. 18, a front end circuit 102 includes a high band circuit 44. A triplexer 16d includes the LPF 16a, the HPF 16b, and a bandpass filter (BPF) 16c. The LPF 16a is connected between the antenna terminal Ant and the node N2. The HPF 16b is connected between the antenna terminal Ant and a node N4. The BPF 16c is connected between the antenna terminal Ant and the node N3.

The high band circuit 44 includes a plurality of pathways L10 through L12 connected to the node N4. The filter F10 in the pathway L10 is the variable filter 10. The filter F11 in the pathway L11 is a duplexer with a fixed frequency. The filter F12 in the pathway L12 is the filter 11 with a fixed passband. The pathway L10 is a pathway for reception signals and transmission signals in band B38, B40, and B41. Since bands B38, B40, and B41 are of the TDD system, the passband of the variable filter 10 is set to the passband of band B38, B40, or B41, and switches transmission signals and reception signals by the switches 12a and 12b. The pathway L11 is a pathway for reception signals and transmission signals in band B7. The pathway L12 is a pathway for reception signals and transmission signals in band B42, and switches transmission signals and reception signals by the switches 12a and 12b. Other structures are the same as those of the first variation of the second embodiment, and the description thereof is omitted.

Figure 19:
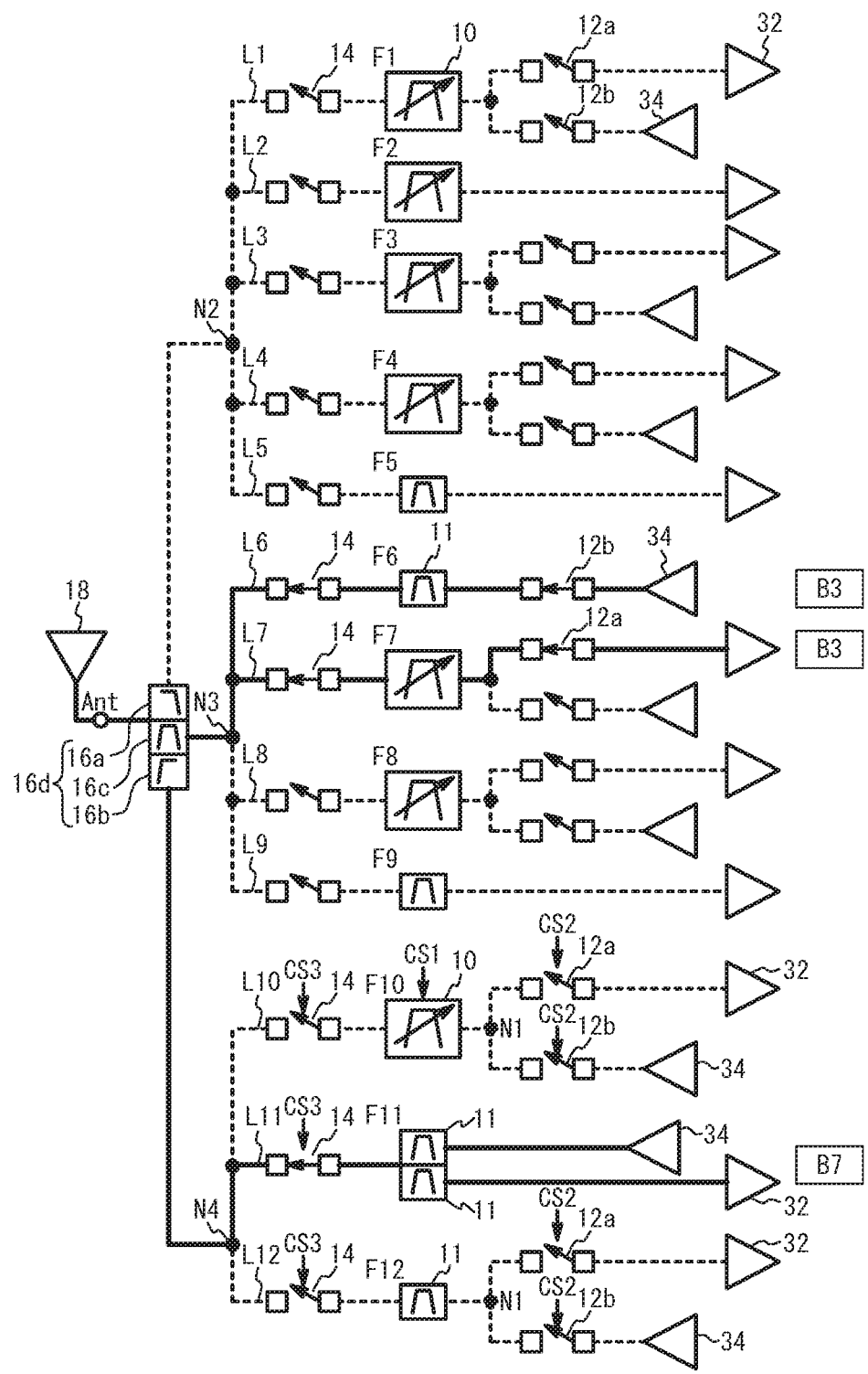
FIG. 19 illustrates an example that executes CA with two bands of the Middle Band and the High Band by using the second variation of the second embodiment.

FIG. 19 illustrates an example that executes CA with two bands of the Middle Band and the High Band by using the front end circuit of the second variation of the second embodiment. As illustrated in FIG. 19, the switches 14 and 12b in the pathway L6, the switches 14 and 12a in the pathway L7, and the switch 14 in the pathway L11 are turned on, and other switches 14, 12a, and 12b are turned off. The passband of the filter F7 is set to the receive frequency of band B3. This setting allows for transmission and reception using bands B3 and B7 at the same time.

Figure 20:
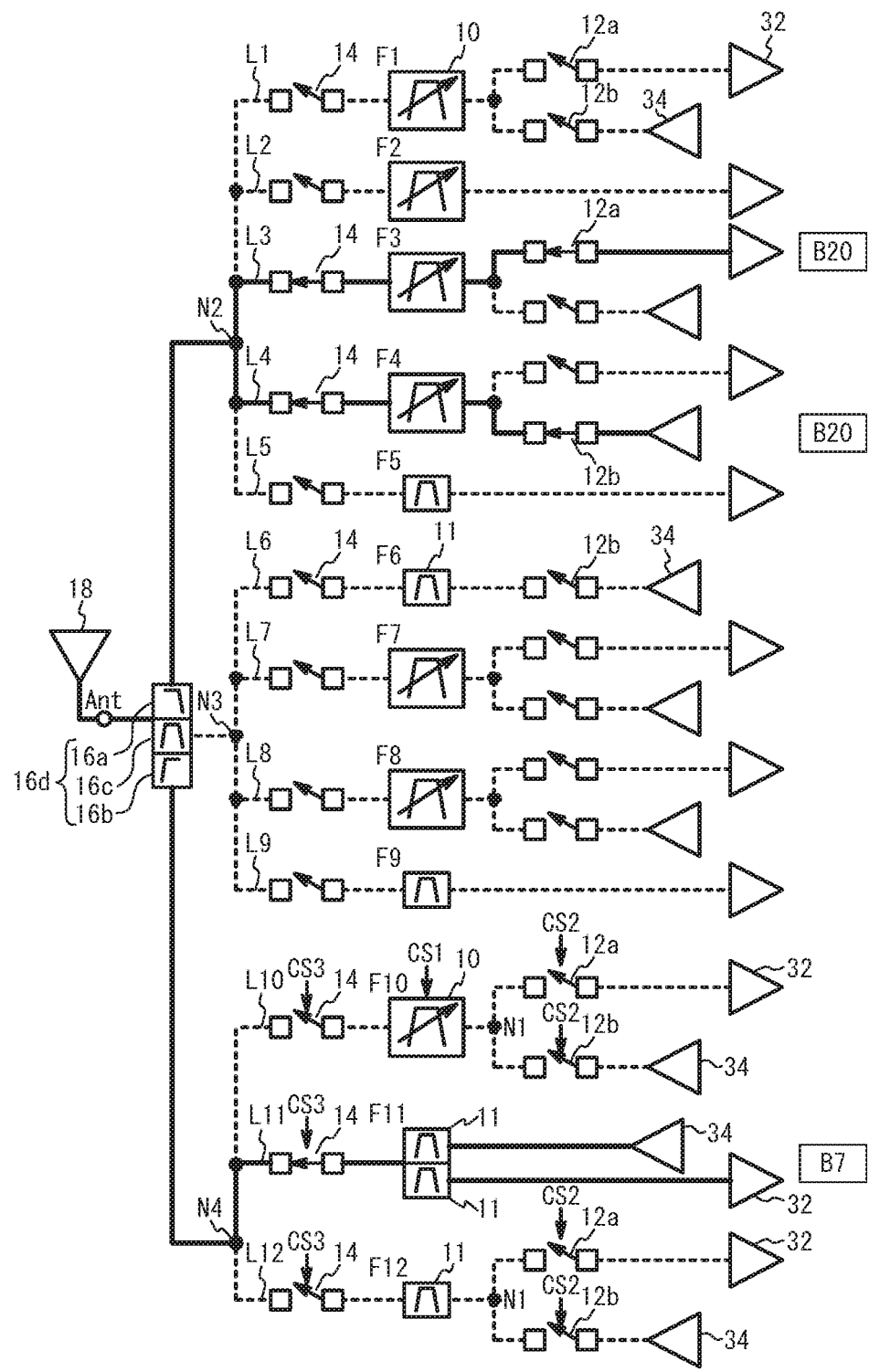
FIG. 20 illustrates an example that executes CA with two bands of the Low Band and the High Band by using the front end circuit of the second variation of the second embodiment.

FIG. 20 illustrates an example that executes CA with two bands of the Low Band and the High Band by using the front end circuit of the second variation of the second embodiment. As illustrated in FIG. 20, the switches 14 and 12a in the pathway L3, the switches 14 and 12b in the pathway L4, and the switch 14 in the pathway L11 are turned on, and other switches 14, 12a, and 12b are turned off. The passband of the filter F3 is set to the receive frequency of band B20. The passband of the filter F4 is set to the transmit frequency of band B20. This setting allows for transmission and reception using bands B20 and B7 at the same time.

Figure 21:
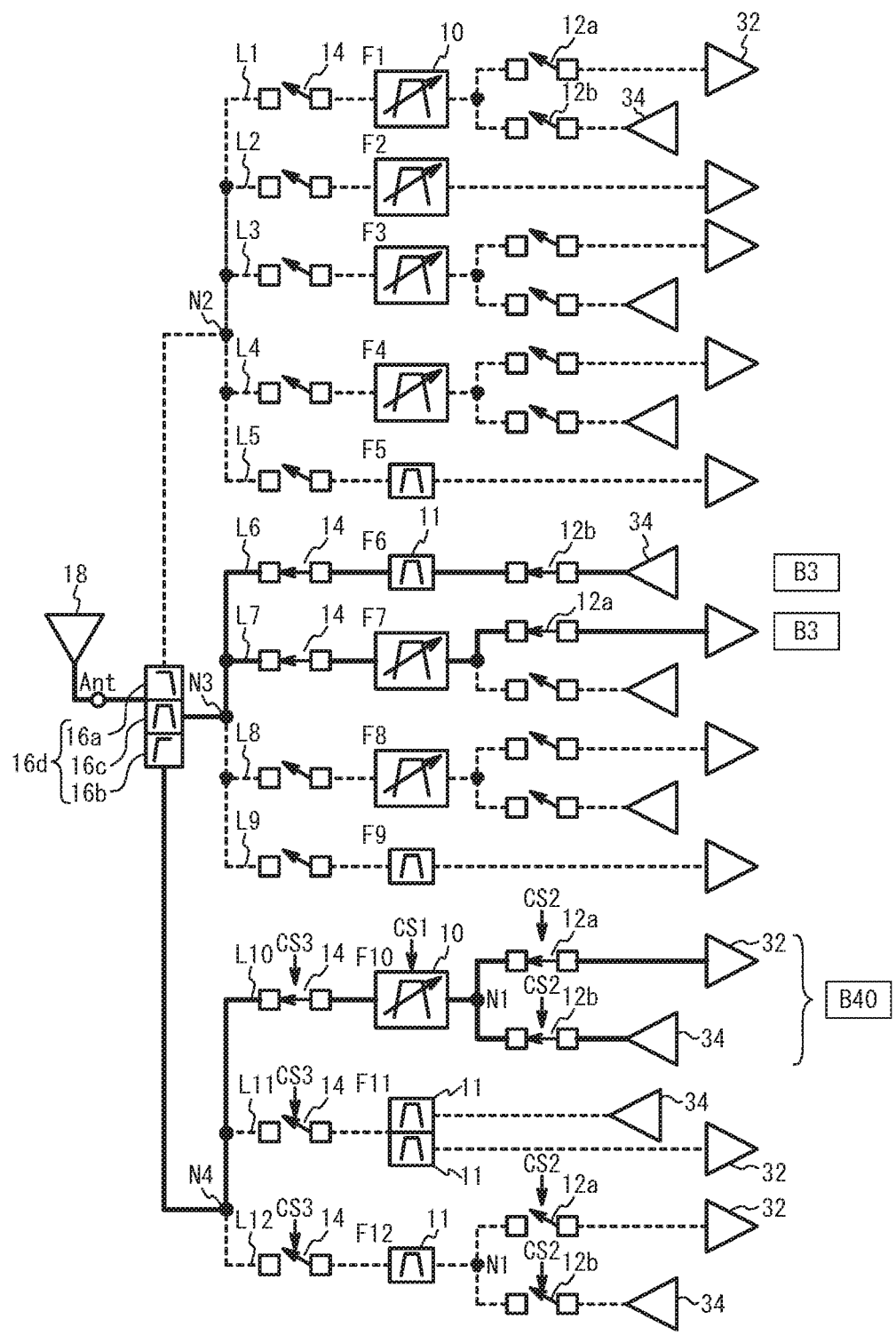
FIG. 21 illustrates another example that executes CA with two bands of the Middle Band and the High Band by using the front end circuit of the second variation of the second embodiment.

FIG. 21 illustrates another example that executes CA with two bands of the Middle Band and the High Band by using the front end circuit of the second variation of the second embodiment. As illustrated in FIG. 21, the switches 14 and 12b in the pathway L6, the switches 14 and 12a in the pathway L7, and the switch 14 in the pathway L10 are turned on. The switches 12a and 12b in the pathway L10 are switched in accordance with transmission and reception of band B40. Other switches 14, 12a, and 12b are turned off. The passband of the filter F7 is set to the receive frequency of band B3. This setting allows for transmission and reception using band B3 of the FDD system and band B40 of the TDD system at the same time.

Figure 22:
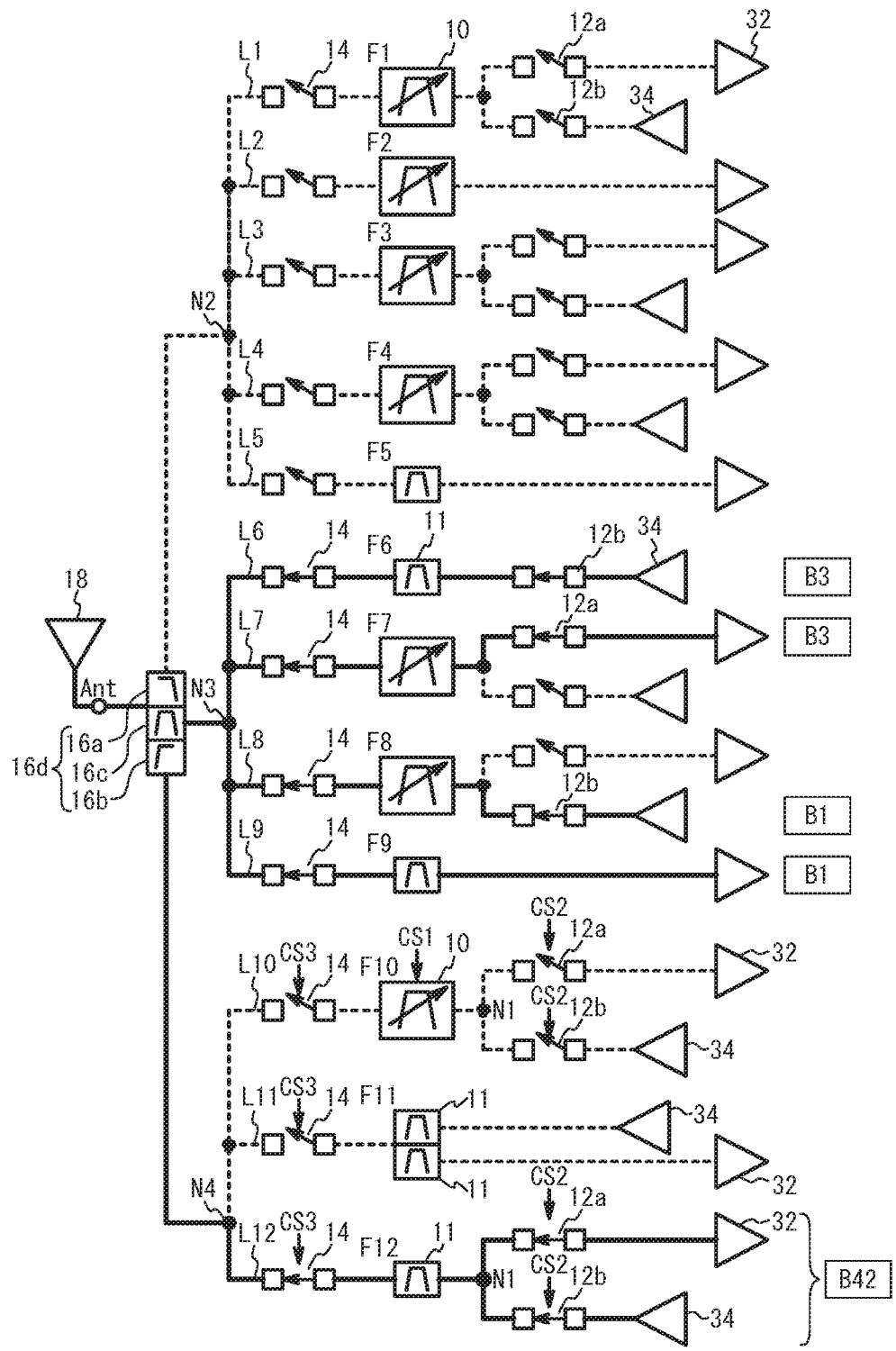
FIG. 22 illustrates an example that executes CA with three bands of the Middle Band and the High Band by using the front end circuit of the second variation of the second embodiment.

FIG. 22 illustrates an example that executes CA with three bands of the Middle Band and the High Band by using the front end circuit of the second variation of the second embodiment. As illustrated in FIG. 22, the switches 14 and 12b in the pathway L6, the switches 14 and 12a in the pathway L7, the switches 14 and 12b in the pathway L8, the switch 14 in the pathway L9, and the switch 14 in the pathway L12 are turned on. The switches 12a and 12b in the pathway L12 are switched in accordance with transmission and reception of band B40. Other switches 14, 12a, and 12b are turned off. The passband of the filter F7 is set to the receive frequency of band B3. The passband of the filter F8 is set to the transmit frequency of band B 1. This setting allows for transmission and reception using bands B1, B3, and B42 at the same time.

Figure 23:
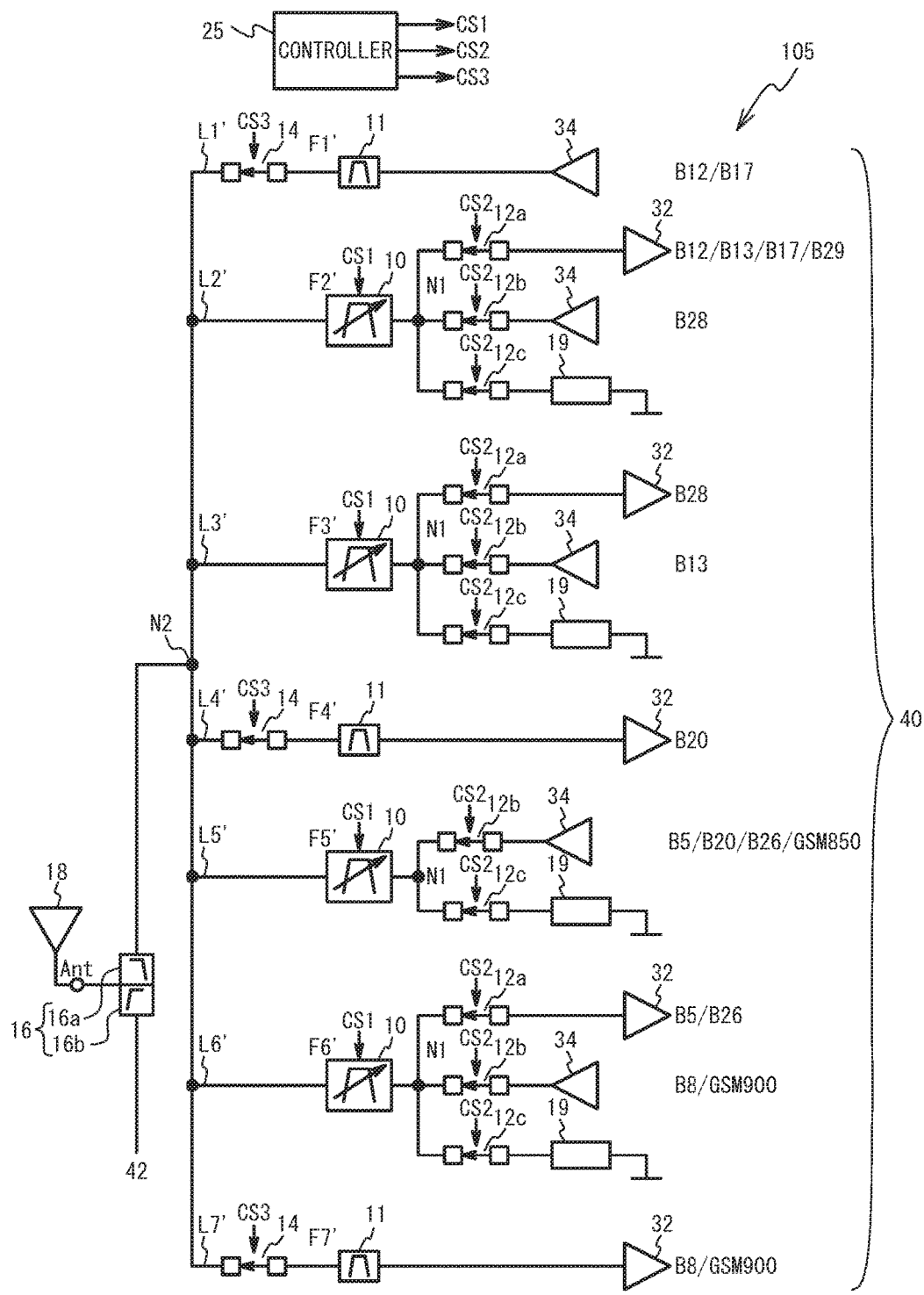
FIG. 23 is a circuit diagram of a front end circuit in accordance with a third variation of the second embodiment.

FIG. 23 is a circuit diagram of a front end circuit in accordance with a third variation of the second embodiment. As illustrated in FIG. 23, in a front end circuit 105, no switch 14 is located in the pathways L2', L3', L5', and L6'. The nodes N1 at the switch 12b side of the filters F2', F3', F5', and F6' are connected to termination resistors 19 through switches 12c. Other structures are the same as those of the second embodiment, and the description thereof is omitted.

When the filters F2', F3', F5', and F6' are used, the switches 12c are turned off, and the filter circuits are controlled as described in FIG. 4. When the filters F2', F3', F5', and F6' are not used (i.e., when none of the first band and the second band is used for communication), the controller 25 sets the passbands of the filters F2', F3', F5', and F6' so that the passbands do not overlap the passbands of other filters. In addition, the controller 25 turns off the switches 12a and 12b, and turns on the switches 12c. This setting causes the nodes N1 to be grounded through the termination resistors 19. Accordingly, the filters that are not being used hardly affect the pass characteristics of other filters. In addition, the suppression characteristics outside the passbands of other filters (especially, variable filters) are improved. Furthermore, the switch 14 can be omitted, and the insertion loss is therefore reduced. The nodes N1 of the filter circuits of the middle band circuit 42 and the high band circuit 44 may be grounded through the switches 12c and the termination resistors 19.

The second embodiment and the variations thereof enable CA or DC. The bands for CA and DC are not limited to the above-described bands.

FIG. 24 lists exemplary combinations of two bands capable of executing CA or DC. FIG. 25A and FIG. 25B list exemplary combinations of three and four bands capable of executing CA or DC, respectively. In FIG. 24 through FIG. 25B, the bands described in the column "LTE BAND" are the names of bands capable of executing CA or DC. The region indicates the region in which CA or DC can be executed. "All" means that CA or DC can be executed in all regions. "APAC (Asia and Pacific)" means that CA or DC can be executed in the Asia region and the Pacific region. "EMEA (Europe Middle East and Africa)" means that CA or DC can be executed in Europe, the Middle East region, and Africa. "NAR (North America Region)" means that CA or DC can be executed in the North America region. "China" indicates that CA or DC can be executed in China.

The use of the combination of bands presented in FIG. 24 allows for the execution of CA or DC with two bands. The use of the combination of bands presented in FIG. 25A allows for the execution of CA or DC with three bands. The use of the combination of bands presented in FIG. 25B allows for the execution of CA or DC with four bands. The combinations of bands and regions presented in FIG. 24 through FIG. 25B are merely an example, and can be changed in accordance with the revise of the standards.

In the second embodiment and the variations thereof, as illustrated in FIG. 10, FIG. 13, and FIG. 18, in the pathways L2', L3', L6', L3, L4, L7, and L8, the filter circuit 30 is connected to the antenna terminal Ant. This structure can reduce the number of filters in the front end circuits 100 and 102.

The switch 14 is connected between the antenna terminal Ant and each filter circuit 30. This structure allows the filter circuit 30 to be connected to the antenna terminal Ant in accordance with the band for transmission and reception.

For example, when transmission and reception of band B5 are performed, the switch 14 (a first switch) and the switch 12b in the pathway L3 and the switch 14 (a second switch) and the switch 12a in the pathway L4 are turned on, and the switch 12a in the pathway L3 and the switch 12b in the pathway L4 are turned off as illustrated in FIG. 17. This setting allows for transmission and reception of band B5. When transmission and reception of band B2 are performed, the switch 14 (a first switch) and the switch 12b in the pathway L7 and the switch 14 (a second switch) and the switch 12a in the pathway L8 are turned on, and the switch 12a in the pathway L7 and the switch 12b in the pathway L8 are turned off. This setting allows for transmission and reception of band B2.

Third Embodiment

Figure 26:
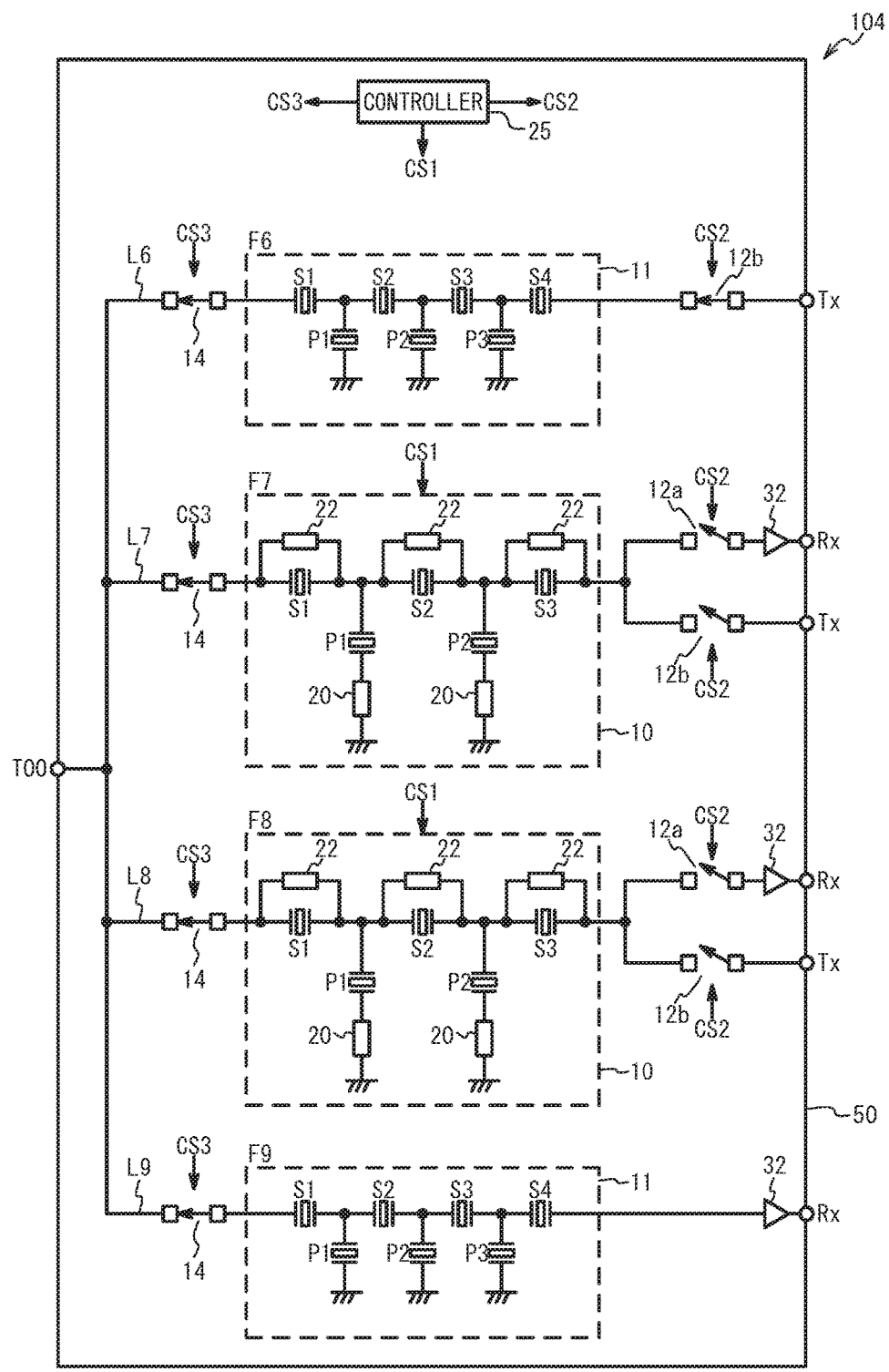
FIG. 26 is a circuit diagram of a module in accordance with a third embodiment.

A third embodiment is an exemplary module. FIG. 26 is a circuit diagram of a module in accordance with the third embodiment. As illustrated in FIG. 26, in a module 104, a part of the middle band circuit 42 of the second embodiment and the variations thereof is mounted on a substrate 50 such as a wiring substrate. The substrate 50 includes terminals T00, Tx, and Rx. The terminal T00 corresponds to the node N3 in FIG. 13. Transmission signals are input to the terminal Tx. Reception signals undergoing the LNA 32 are output to the terminal Rx. Mounted on the substrate 50 are the switches 12a, 12b, and 14, the variable filter 10, the filter 11, and the LNA 32 in the pathways L6 through L9. Each of the filters 11 in the pathways L6 and L9 includes the series resonators S1 through S4 and the parallel resonators P1 through P3. The variable filters in the pathways L7 and L8 are the variable filters of FIG. 9. The controller 25 is a general processor such as a CPU or a dedicated processor. The controller 25 outputs the control signals CS1 to the variable filters 10, the control signals CS2 to the switches 12a and 12b, and the control signals CS3 to the switches 14.

Figure 27:
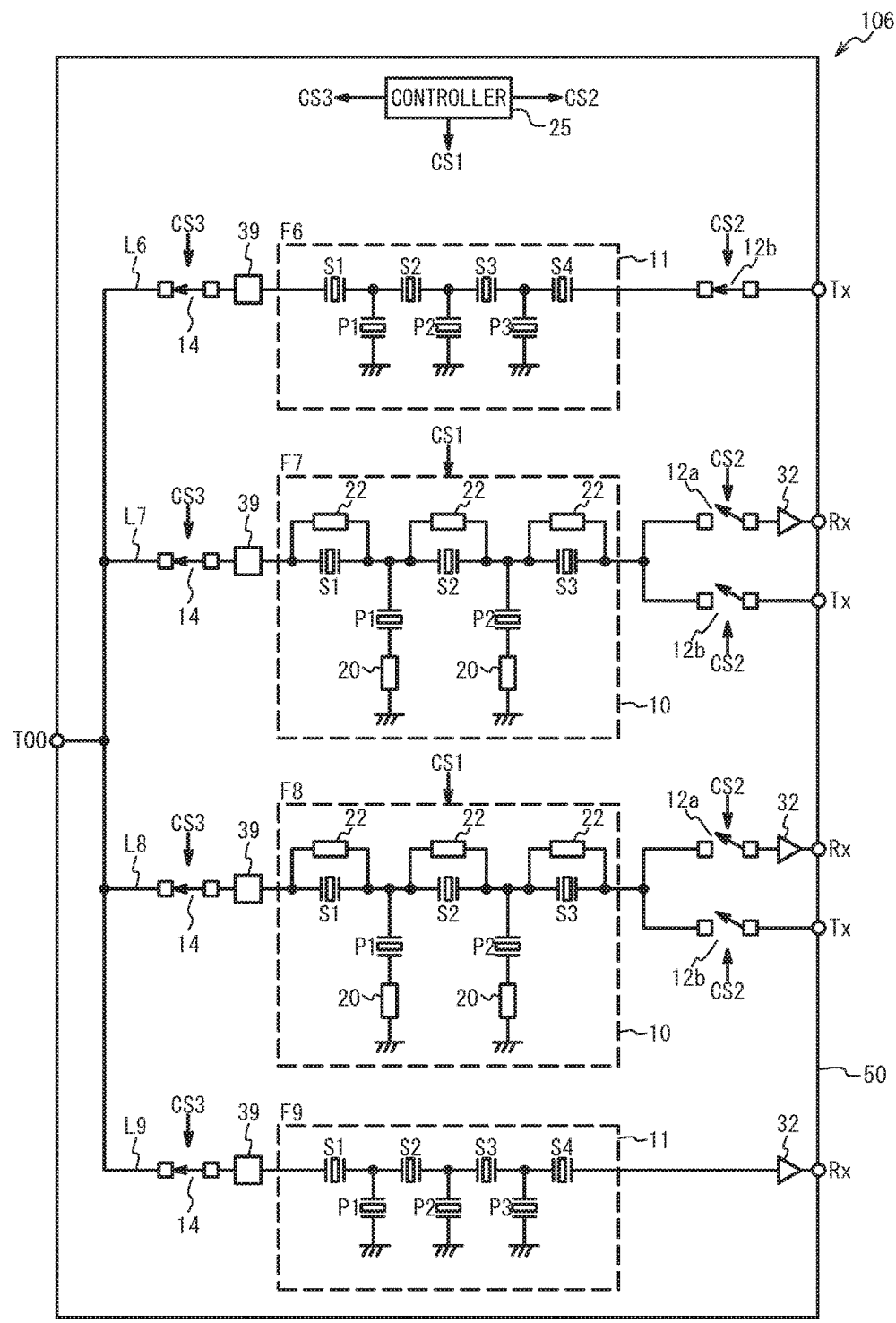
FIG. 27 is a circuit diagram of a module in accordance with a first variation of the third embodiment.

FIG. 27 is a circuit diagram of a module in accordance with a first variation of the third embodiment. As illustrated in FIG. 27, in a module 106, variable impedance circuits 39 are connected between the switches 14 and the variable filters 10 or the filters 11. The variable impedance circuit 39 changes the phase and/or the impedance in accordance with the band to be used. This structure can improve the isolation between bands. Other structures are the same as those of the third embodiment, and the description thereof is thus omitted.

As described in the third embodiment, the variable filter 10 and the switches 12a and 12b of the filter circuit 30 of the first embodiment and the variations thereof are mounted on the substrate 50. This structure can reduce the number of filters in a module. The third embodiment and the variation thereof have described an exemplary case where a part of the middle band circuit 42 of the second embodiment is mounted on the substrate 50, but a part of the low band circuit 40 of the second embodiment or a part of the high band circuit 44 of the first variation of the second embodiment may be mounted on the substrate 50. The components to be mounted to a module can be appropriately selected.

Fourth Embodiment

Figure 28:
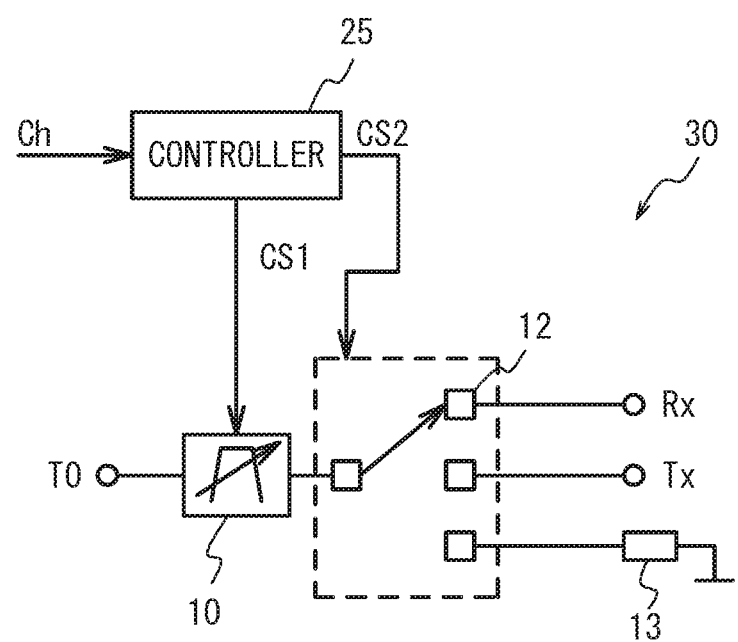
FIG. 28 is a block diagram of a filter circuit in accordance with a fourth embodiment.

FIG. 28 is a block diagram of a filter circuit in accordance with a fourth embodiment. As illustrated in FIG. 28, the variable filter 10 and a switch 12 are provided. The switch 12 is a Single pole Three Throw (SP3T) type switch. The switch 12 selects and connects one of the receive terminal Rx, the transmit terminal Tx, and a termination resistor 13 to the node N1. The termination resistor 13 includes a first end coupled to a ground and a second end coupled to the switch 12. The impedance of the termination resistor 13 is a reference impedance such as 50Ω. The receive terminal Rx and the transmit terminal Tx support different LTE bands. Other structures are the same as those of the first embodiment, and the description thereof is omitted.

Figure 29:
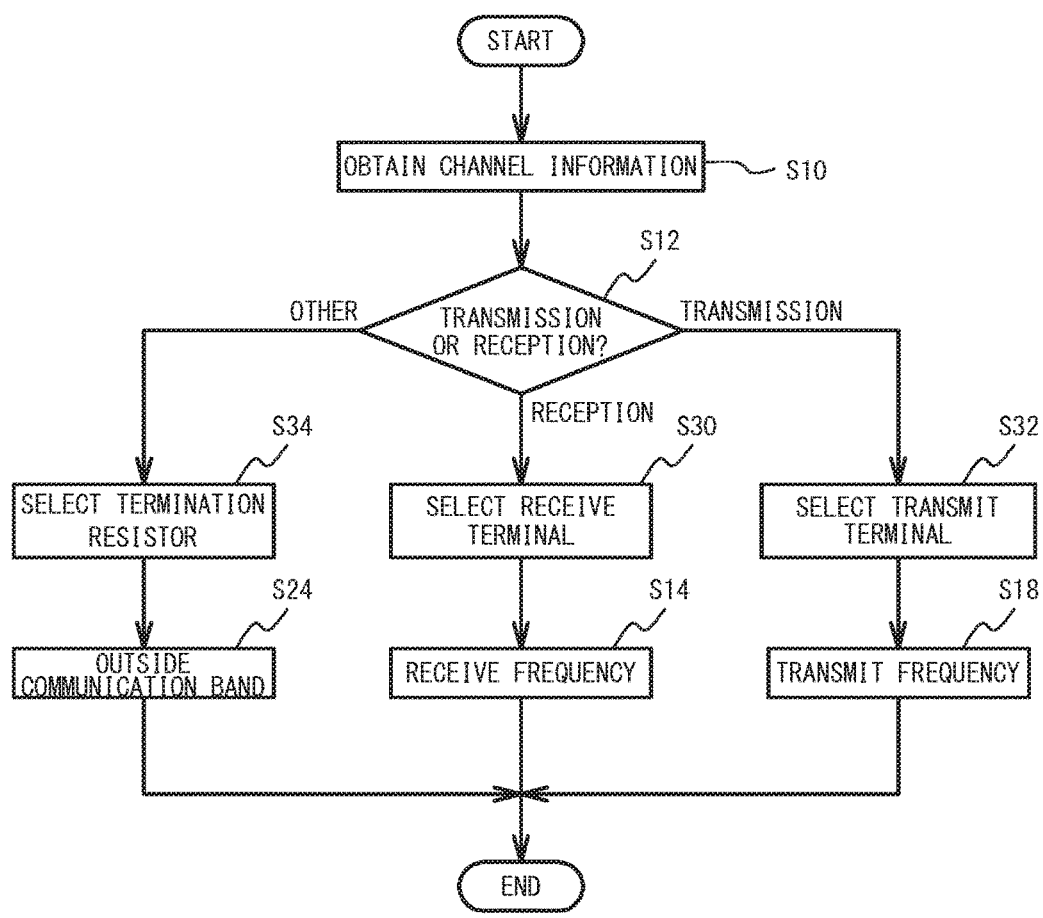
FIG. 29 is a flowchart of the control executed by the controller in the fourth embodiment.

FIG. 29 is a flowchart of the control executed by the controller of the fourth embodiment. As illustrated in FIG. 29, when the determination is "reception" at step S12, the controller 25 selects the receive terminal Rx from three ports to which the switch 12 is to be connected (step S30). When the determination is "transmission" at step S12, the controller 25 selects the transmit terminal Tx from three ports to which the switch 12 is to be connected (step S32). When the determination is "other" at step S12, the controller 25 selects a terminal connecting to the termination resistor 13 from three ports to which the switch 12 is to be connected (step S34). For example, the controller 25 outputs the control signal CS2 for switching the switch 12. Other controls are the same as those of the first embodiment, and the description thereof is omitted.

At step S24, for example, the controller 25 outputs the control signal CS1 to make the passband of the variable filter 10 located at frequencies away from the band being used for communication. For example, in FIG. 11, when not the filter F3' but the filter F4' is used as the receive filter of band B20, the controller 25 sets the passband of the filter F3' so that the passband of the filter F3' does not overlap the receive frequency of band B20. Furthermore, the passband of the filter F3' is set so as to be away from the receive frequency of band B20. For example, the passband of the filter F3' is set to approximately 775 MHz.

In the fourth embodiment, the switch 12 selects and connects one of the receive terminal Rx, the transmit terminal Tx, and the termination resistor 13 to the node N1. When the switch 12 selects the termination resistor 13, unnecessary high-frequency signals passing through the variable filter 10 are consumed in the termination resistor 13. Accordingly, the high-frequency signals can be inhibited from interfering with other bands (for example, the band adjacent to the passband of the variable filter 10).

In addition, as described at step S34 of FIG. 29, when none of a reception signal and a transmission signal is used for communication, the switch 12 selects and connects the termination resistor 13 to the node N1. As described at step S24, the passband of the variable filter 10 is set to a band other than the receive frequency of the reception signal and the transmit frequency of the transmission signal. Accordingly, when none of the reception signal and the transmission signal is used for communication, unnecessary high-frequency signals passing through the variable filter 10 can be inhibited from interfering with the adjacent band.

In a first variation of the fourth embodiment, assume that the reception signal output from the receive terminal Rx and the transmission signal input to the transmit terminal Tx are signals in the same LTE band of the TDD system. Other structures are the same as those of the third embodiment, and the description thereof is omitted.

Figure 30:
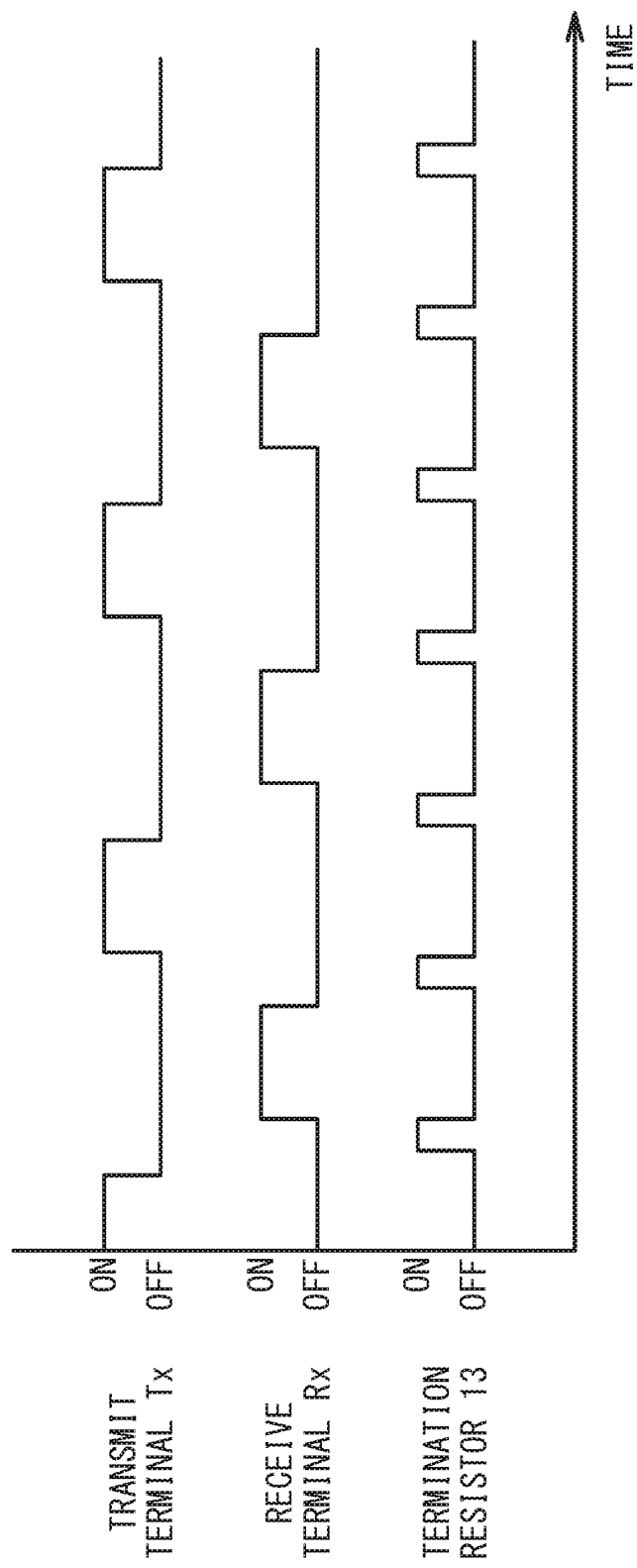
FIG. 30 is a timing chart of switching in a first variation of the fourth embodiment.

FIG. 30 is a timing chart of the switching in the first variation of the fourth embodiment. In FIG. 30, "ON" of the transmit terminal Tx indicates that the switch 12 selects the transmit terminal Tx, "ON" of the receive terminal Rx indicates that the switch 12 selects the receive terminal Rx, "ON" of the termination resistor 13 indicates that the switch 12 selects the termination resistor 13, and "OFF" indicates that the switch 12 does not select the transmit terminal Tx, the receive terminal Rx, or the termination resistor 13. As illustrated in FIG. 30, in the time frame for transmission signals (uplink), the controller 25 selects the transmit terminal Tx as a port to which the switch 12 is connected. This selection causes the transmission signal input to the transmit terminal Tx to be output from the terminal T0. In the time frame between the transmission signal and the reception signal, the controller 25 selects the termination resistor 13 as a port to which the switch 12 is connected. During this time, a time frame for downlink is formed. In the time frame for reception signals (downlink), the controller 25 selects the receive terminal Rx as a port to which the switch 12 is connected. This selection causes the reception signal input to the terminal T0 to be output from the receive terminal Rx. In the time frame between the reception signal and the transmission signal, the controller 25 selects the termination resistor 13 as a port to which the switch 12 is connected.

In the first variation of the fourth embodiment, the reception signal and the transmission signal are signals in the same band of the TDD system. As illustrated in FIG. 30, the switch 12 connects the transmit terminal Tx, the termination resistor 13, the receive terminal Rx, and the termination resistor 13 to the node N1 in this order. Accordingly, the effect of load variation of the variable filter 10 at the time of switching between the transmission and the reception can be reduced, and the frequency of the variable filter 10 can be stabilized.

Even during the non-operation time in which the communication device does not perform communication while intermittently receiving signals, the switch 12 can select the termination resistor 13. Thus, the load variation of the variable filter 10 can be reduced.

Figure 31:
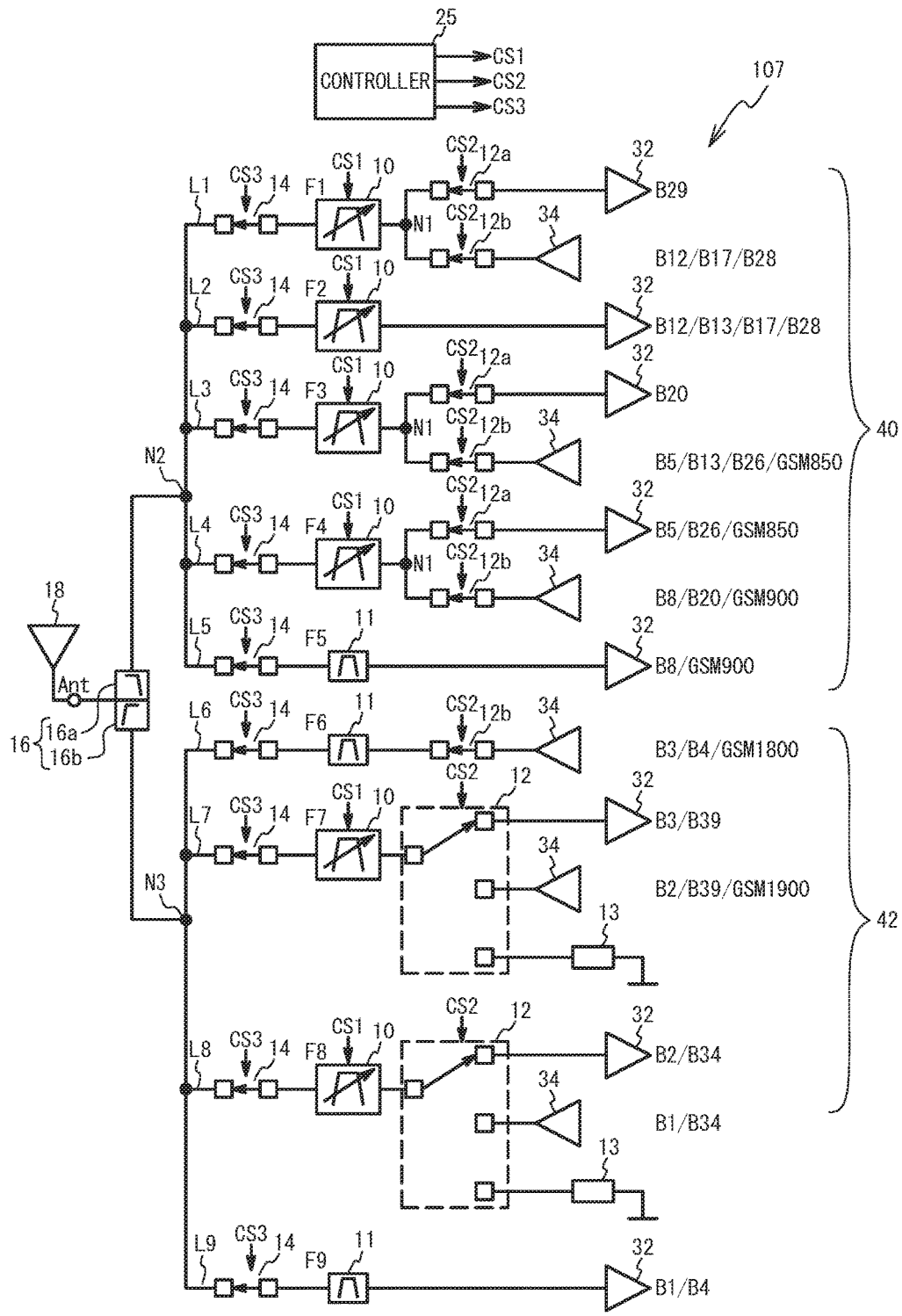
FIG. 31 is a circuit diagram of a front end circuit employing the first variation of the fourth embodiment.

FIG. 31 is a circuit diagram of a front end circuit employing the first variation of the fourth embodiment. As illustrated in FIG. 31, in a front end circuit 107, the filter circuits of the first variation of the third embodiment are used in the pathways L7 and L8. The pathway L7 is a pathway for reception signals in band B3 or B39 and transmission signals in band B2 or B39 or GSM 1900. The pathway L8 is a pathway for reception signals in band B2 or B34 and transmission signals in band B1 or B34. Other structures are the same as those illustrated in FIG. 13 of the first variation of the second embodiment, and the description thereof is omitted.

Figure 32:
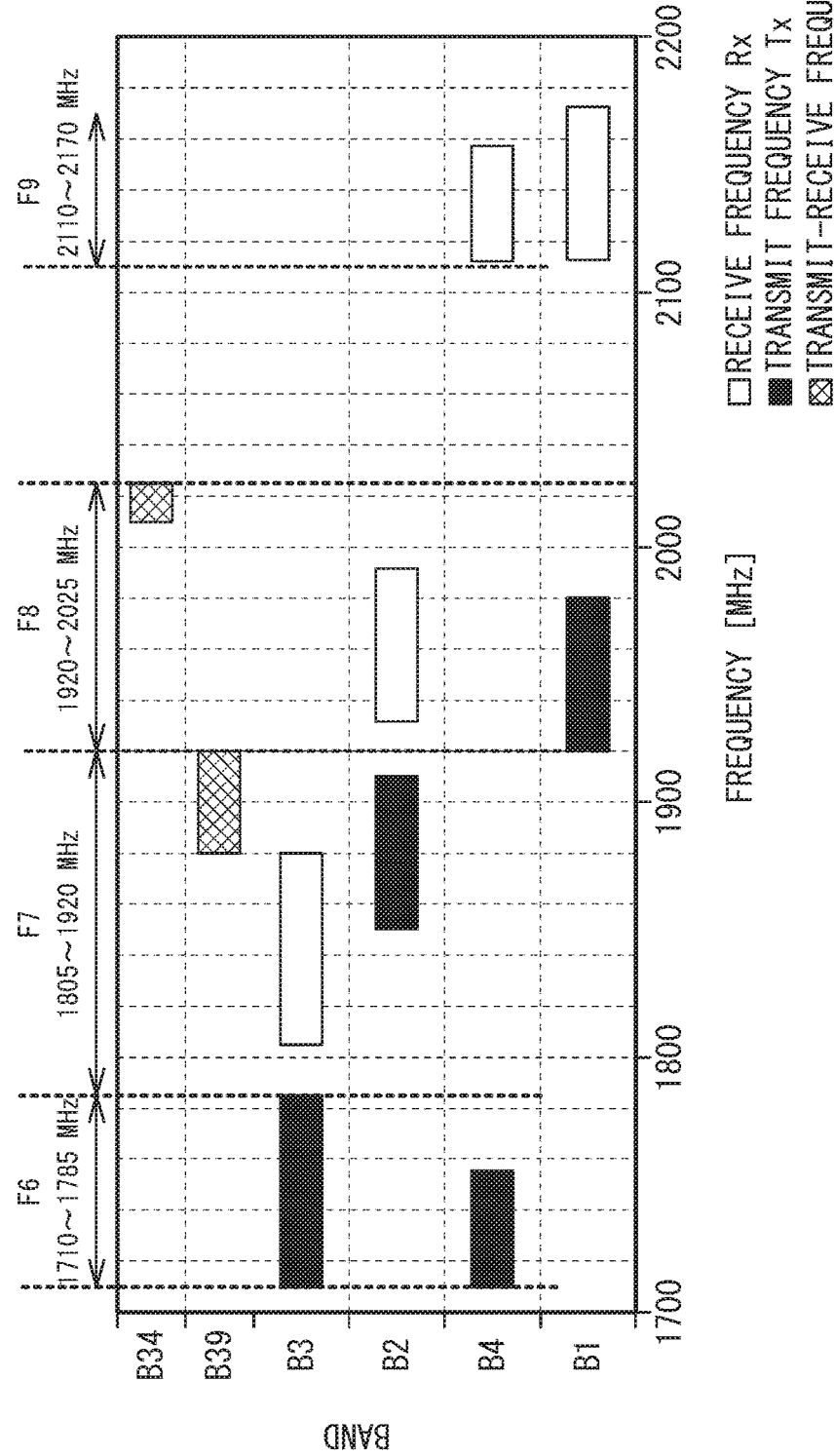
FIG. 32 illustrates the frequency bands of filters for the Middle Band in the first variation of the fourth embodiment.

FIG. 32 illustrates the frequency bands of filters for the Middle Band in the first variation of the fourth embodiment. As illustrated in FIG. 32, bands B34 and B39 are of the TDD system, and the transmit frequency and the receive frequency are the same transmission-reception band. The transmission-reception band of band B39 is from 1880 MHz to 1920 MHz. The filter F7 supports 1805 MHz to 1920 MHz. The transmission-reception band of band B34 is from 2010 MHz to 2025 MHz. The filter F8 supports 1920 MHz to 2025 MHz. Other structures are the same as those illustrated in FIG. 12 of the second embodiment, and the description thereof is omitted.

When the filter F7 functions as a transmission-reception filter for band B39, and when the filter F8 functions as a transmission-reception filter for band B34, the switch 12 is switched as described in FIG. 30. The band of the TDD system handled by the filter F7 may be band B35 instead of band B39. The band of the TDD system handled by the filter F8 may be band B36 instead of band B34.

The variable filter 10 and the switch 12b of the filter circuit 30 of the fourth embodiment and the variations thereof may be mounted on the substrate 50 of the third embodiment.

Although the embodiments of the present invention have been described in detail, it is to be understood that the various change, substitutions, and alterations could be made hereto without departing from the spirit and scope of the invention.

What is claimed is:

1. A filter circuit comprising:
a variable filter that is connected between a common terminal and a node and configured to change at least one of a low-frequency end and a high frequency end of a passband thereof;
a receive switch connected between a receive terminal, from which a reception signal in a first receive band of a first band is output, and the node, said first band being corresponding to an E-UTRA operating band and including a first transmit band and said first receive band, a reception signal in the first receive band being output from the receive terminal; and
a transmit switch connected between a transmit terminal, to which a transmission signal in a second transmit band of a second band is input, and the node, said second band being corresponding to an E-UTRA operating band that is different from the first band and including said second transmit band and a second receive band, and
wherein a difference between a high-frequency end of the first receive band and a high-frequency end of the second transmit band is smaller than a difference between the high-frequency end of the first receive band and a high-frequency end of the first transmit band and a difference between a high-frequency end of the second receive band and the high-frequency end of the second transmit band, and
wherein a difference between a low-frequency end of the first receive band and a low-frequency end of the second transmit band is smaller than a difference between the low-frequency end of the first receive band and a low-frequency end of the first transmit band and a difference between a low-frequency end of the second receive band and the low-frequency end of the second transmit band.

2. The filter circuit according to claim 1, wherein
when the reception signal in the first receive band is received, the passband of the variable filter is changed to the first receive band of the first band, the receive switch is turned on, and the transmit switch is turned off, and
when the transmission signal in the second transmit band is transmitted, the passband of the variable filter is changed to the second transmit band of the second band, the receive switch is turned off, and the transmit switch is turned on.

3. The filter circuit according to claim 1, wherein
when the reception signal in the first receive band is received, the transmit switch is turned off and the passband of the variable filter is changed to the first receive band of the first band, and thereafter, the receive switch is turned on, and
when the transmission signal in the second transmit band is transmitted, the receive switch is turned off and the passband of the variable filter is changed to the second transmit band of the second band, and thereafter, the transmit switch is turned on.

4. The filter circuit according to claim 1, further comprising:
a termination resistor; and
a termination switch connected between the node and the termination resistor.

5. The filter circuit according to claim 4,
wherein when none of the first band and the second band is used for communication, the receive switch and the transmit switch are turned off, and the termination switch is turned on.

6. The filter circuit according to claim 1, wherein
the first receive band of the first band and the second transmit band of the second band partially overlap and are different,
a part of the first receive band of the first band does not overlap with the second transmit band of the second band and/or a part of the second transmit band of the second band does not overlap with the first receive band of the first band.

7. The filter circuit according to claim 1, wherein
at least one of the first band and the second band is of an FDD system.

8. The filter circuit according to claim 1, further comprising:
a controller configured to:
change the passband of the variable filter to the first receive band of the first band, turn on the receive switch, and turn off the transmit switch when the reception signal in the first receive band is received; and
change the passband of the variable filter to the second transmit band of the second band, turn off the receive switch, and turn on the transmit switch when the transmission signal in the second transmit band is transmitted.

9. A front end circuit comprising:
a first filter circuit and a second filter circuit that are the filter circuits according to claim 1 of which the common terminals are connected to an antenna terminal.

10. The front end circuit according to claim 9, further comprising:
a first switch connected between the antenna terminal and the common terminal of the first filter circuit; and
a second switch connected between the antenna terminal and the common terminal of the second filter circuit.

11. The front end circuit according to claim 10, wherein
the first receive band of the first filter circuit and the second transmit band of the second filter circuit are included in a same E-UTRA operating band, and
when transmission and reception of the same E-UTRA operating band are performed, the first switch, the second switch, the receive switch of the first filter circuit, and the transmit switch of the second filter circuit are turned on, and the transmit switch of the first filter circuit and the receive switch of the second filter circuit are turned off.

12. A module comprising:
a substrate; and
the variable filter, the receive switch, and the transmit switch of the filter circuit according to claim 1 mounted on the substrate.

13. The filter circuit according to claim 1, wherein the variable filter includes:
an acoustic wave resonator; and
an adjustment circuit that is connected in parallel and/or series to the acoustic wave resonator and configured to change an impedance thereof.

14. A filter circuit, comprising:
a variable filter that is connected between a common terminal and a node and configured to change of a passband thereof;
a receive switch connected between a receive terminal, from which a reception signal in a first receive band of a first band is output, and the node, said first band being corresponding to an E-UTRA operating band and including a first transmit band and said first receive band, a reception signal in the first receive band being output from the receive terminal; and
a transmit switch connected between a transmit terminal, to which a transmission signal in a second transmit band of a second band is input, and the node, said second band being corresponding to an E-UTRA operating band that is different from the first band and including said second transmit band and a second receive band,
wherein a difference between a high-frequency end of the first receive band and a high-frequency end of the second transmit band is smaller than a difference between the high-frequency end of the first receive band and a high-frequency end of the first transmit band and a difference between a high-frequency end of the second receive band and the high-frequency end of the second transmit band,
wherein a difference between a low-frequency end of the first receive band and a low-frequency end of the second transmit band is smaller than a difference between the low-frequency end of the first receive band and a low-frequency end of the first transmit band and a difference between a low-frequency end of the second receive band and the low-frequency end of the second transmit band,
wherein the variable filter includes:
an acoustic wave resonator;
a first capacitor connected in parallel to the acoustic wave resonator between a first node and a second node;
a pathway that is connected in series to the acoustic wave resonator between the first node and the second node and connected in parallel to the first capacitor between the first node and the second node, and in which a second capacitor and a first switch are connected in series between the first node and the second node; and
at least one of a third capacitor and a second switch connected in series to the acoustic wave resonator between the first node and the second node and connected in parallel to the pathway between the first node and the second node, and
wherein the first node is connected to the common terminal not through the acoustic wave resonator and the second node is connected to the node not through the acoustic wave resonator.

* * * * *